US010755946B2

(12) United States Patent
Hirata et al.

(10) Patent No.: US 10,755,946 B2
(45) Date of Patent: Aug. 25, 2020

(54) METHOD FOR PRODUCING A WAFER FROM A HEXAGONAL SINGLE CRYSTAL INGOT BY APPLYING A LASER BEAM TO FORM A FIRST PRODUCTION HISTORY, AN EXFOLIATION LAYER, AND A SECOND PRODUCTION HISTORY

(71) Applicant: DISCO CORPORATION, Tokyo (JP)

(72) Inventors: Kazuya Hirata, Tokyo (JP); Ryohei Yamamoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 93 days.

(21) Appl. No.: 16/192,250

(22) Filed: Nov. 15, 2018

(65) Prior Publication Data

US 2019/0148164 A1 May 16, 2019

(30) Foreign Application Priority Data

Nov. 16, 2017 (JP) ................. 2017-221073

(51) Int. Cl.
*C30B 33/02* (2006.01)
*H01L 21/321* (2006.01)
*H01L 29/16* (2006.01)
*H01L 21/04* (2006.01)
*H01L 21/687* (2006.01)
*B24B 37/00* (2012.01)
*B23K 26/00* (2014.01)
(Continued)

(52) U.S. Cl.
CPC ........ *H01L 21/32115* (2013.01); *B23K 26/00* (2013.01); *B24B 7/04* (2013.01); *B24B 7/228* (2013.01); *B24B 37/00* (2013.01); *C30B 29/00* (2013.01); *H01L 21/0445* (2013.01); *H01L 21/68742* (2013.01); *H01L 29/1608* (2013.01)

(58) Field of Classification Search
CPC .. C30B 1/00; C30B 1/02; C30B 29/00; C30B 29/10; C30B 29/36; C30B 30/00; C30B 31/00; C30B 31/20; C30B 33/00; C30B 33/02; C30B 33/06; H01L 21/32115; H01L 21/0445; H01L 21/68742; H01L 29/1608; B23K 26/00; B24B 7/04; B24B 7/228; B24B 37/00
USPC ................ 117/2–4, 7, 904, 915, 937, 951
See application file for complete search history.

(56) References Cited

U.S. PATENT DOCUMENTS

2016/0268212 A1* 9/2016 Suzuki ................ H01L 29/872

FOREIGN PATENT DOCUMENTS

| JP | 2000094221 A | | 4/2000 |
|---|---|---|---|
| JP | 2013049161 A | | 3/2013 |
| JP | 2013049161 A | * | 3/2013 |

* cited by examiner

*Primary Examiner* — Kenneth A Bratland, Jr.
(74) *Attorney, Agent, or Firm* — Greer Burns & Crain Ltd.

(57) ABSTRACT

A method for producing a wafer from a hexagonal single crystal ingot includes: planarizing an upper surface of the hexagonal single crystal ingot; applying a laser beam of such a wavelength as to be transmitted through the ingot, with a focal point positioned in an inside of a region not to be formed with devices of a wafer to be produced from the upper surface of the ingot which has been planarized, to form a production history; and applying a laser beam of such a wavelength as to be transmitted through the hexagonal single crystal ingot with a focal point of the laser beam positioned at a depth corresponding to a thickness of the wafer to be produced from the upper surface of the hexagonal single crystal ingot which has been planarized, to form an exfoliation layer.

3 Claims, 20 Drawing Sheets

(51) Int. Cl.
*B24B 7/04* (2006.01)
*C30B 29/00* (2006.01)
*B24B 7/22* (2006.01)

FIG.12A
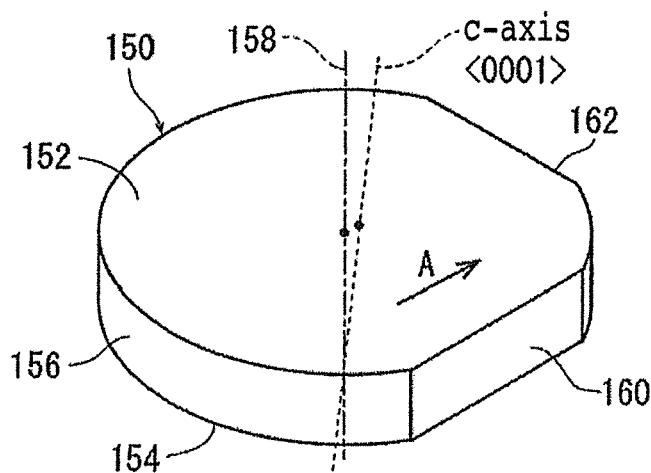
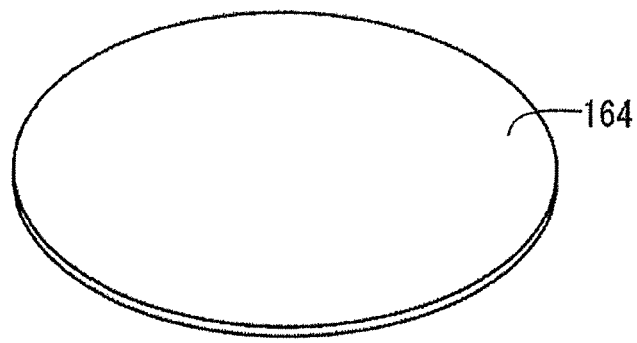
FIG.12B
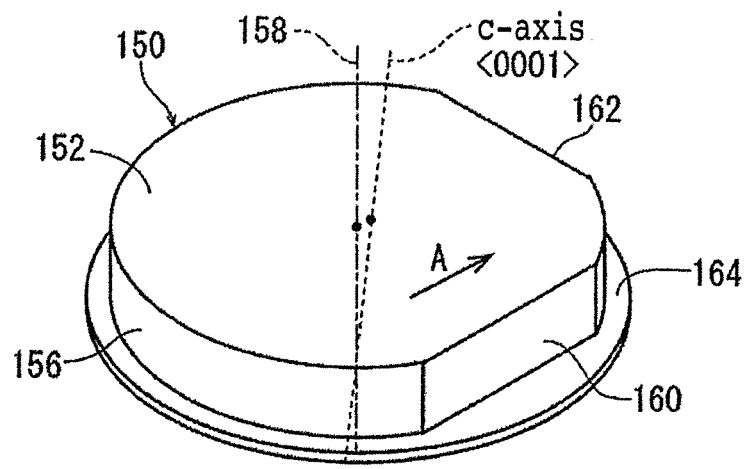

METHOD FOR PRODUCING A WAFER FROM A HEXAGONAL SINGLE CRYSTAL INGOT BY APPLYING A LASER BEAM TO FORM A FIRST PRODUCTION HISTORY, AN EXFOLIATION LAYER, AND A SECOND PRODUCTION HISTORY

BACKGROUND OF THE INVENTION

Field of the Invention

The present invention relates to a wafer producing method and a wafer producing apparatus for producing a wafer from a hexagonal single crystal ingot.

Description of the Related Art

Devices such as integrated circuits (ICs), large scale integrations (LSIs) and light-emitting diodes (LEDs) are formed by forming a functional layer on a front side of a wafer formed from Si (silicon), $Al_2O_3$ (sapphire) or the like and partitioning the functional layer by a plurality of intersecting division lines (streets). In addition, devices such as power devices and LEDs are formed by forming a functional layer on a front side of a wafer formed from single crystal SiC (silicon carbide) and partitioning the functional layer by a plurality of intersecting division lines. The wafer formed with the devices is divided into individual device chips by processing along the division lines by a cutting apparatus or a laser processing apparatus, and the thus divided device chips are used for electric apparatuses such as mobile phones and personal computers.

The wafer to be formed with the devices is generally produced by thinly cutting a cylindrical semiconductor ingot by a wire saw. The front side and the back side of the wafer thus cut are mirror finished by polishing (see, for example, Japanese Patent Laid-Open No. 2000-94221). When the semiconductor ingot is cut by a wire saw and the front side and the back side of the cut wafers are polished, however, most part (70% to 80%) of the semiconductor ingot is discarded, which is uneconomical. Particularly, a hexagonal single crystal SiC ingot is high in hardness and is difficult to cut by a wire saw, so that a considerable time is taken for cutting and productivity is therefore poor. In addition, the hexagonal single crystal SiC ingot is high in unit cost, and has a problem as to efficient wafer production.

In view of the foregoing, there has been proposed a technology wherein a laser beam of such a wavelength as to be transmitted through the hexagonal single crystal SiC is applied to a hexagonal single crystal SiC ingot, with a focal point of the laser beam positioned in the inside of the hexagonal single crystal SiC ingot, to form an exfoliation layer at a cutting plane, and a wafer is exfoliated from the hexagonal single crystal SiC ingot along the cutting plane where the exfoliation layer is formed (see, for example, Japanese Patent Laid-Open No. 2013-49161).

SUMMARY OF THE INVENTION

However, the history of the wafer produced from the hexagonal single crystal SiC ingot is not necessarily clear. When a defect is generated in a device in the process of formation of the wafer with devices, therefore, it is impossible to trace back the history of the wafer and investigate the cause of the defect in the device.

It is therefore an object of the present invention to provide a wafer producing method and a wafer producing apparatus by which a history of a wafer can be left in the wafer.

In accordance with an aspect of the present invention, there is provided a wafer producing method for producing a wafer from a hexagonal single crystal ingot. The wafer producing method includes: a planarization step of planarizing an upper surface of the hexagonal single crystal ingot; a first production history forming step of applying a laser beam of such a wavelength as to be transmitted through the hexagonal single crystal ingot to the hexagonal single crystal ingot, with a focal point of the laser beam positioned in an inside of a region not to be formed with devices of a wafer to be produced secondly, from the upper surface of the hexagonal single crystal ingot which has been planarized, to form a production history; an exfoliation layer forming step of applying a laser beam of such a wavelength as to be transmitted through the hexagonal single crystal ingot to the hexagonal single crystal ingot, with a focal point of the laser beam positioned at a depth corresponding to a wafer to be produced firstly, from the upper surface of the hexagonal single crystal ingot which has been planarized, to form an exfoliation layer; a second production history forming step of applying a laser beam of such a wavelength as to be transmitted through the hexagonal single crystal ingot to the hexagonal single crystal ingot, with a focal point of the laser beam positioned in an inside of a region not to be formed with devices of the wafer to be produced firstly, from the upper surface of the hexagonal single crystal ingot which has been planarized, to form a production history; and a wafer exfoliation step of exfoliating the wafer to be produced firstly from the hexagonal single crystal ingot, with the exfoliation layer as a starting point of exfoliation, to produce a wafer. The planarization step, the first production history forming step, the exfoliation layer forming step, and the wafer exfoliation step are repeated.

Preferably, the production histories formed in the first production history forming step and the second production history forming step include any one of a lot number of the hexagonal single crystal ingot, an order of the wafer produced, a production date of the wafer, a production plant of the wafer, and a machine model that has contributed to the production of the wafer.

Preferably, the hexagonal single crystal ingot is a hexagonal single crystal SiC ingot having a first surface, a second surface opposite to the first surface, a c-axis extending from the first surface to the second surface, and a c-plane orthogonal to the c-axis, with the c-axis being inclined relative to a perpendicular to the first surface, and with an off angle being formed by the c-plane and the first surface, and in the exfoliation layer forming step, a pulsed laser beam of such a wavelength as to be transmitted through the hexagonal single crystal SiC ingot is applied to the hexagonal single crystal SiC ingot, with a focal point of the pulsed laser beam positioned at a depth corresponding to a thickness of a wafer to be produced from the first surface, and with the hexagonal single crystal SiC ingot and the focal point being relatively moved in a first direction orthogonal to a second direction in which the off angle is formed, to cause SiC to be separated into Si and C, to cause the pulsed laser beam applied next to be absorbed in previously formed C, and to cause SiC to be separated into Si and C in a chain reaction manner, thereby forming a rectilinear modified layer and forming a crack extending from the modified layer along the c-plane, and the hexagonal single crystal SiC ingot and the focal point are relatively moved in the direction in which the off angle is formed, to perform indexing by a predetermined amount, thereby forming the exfoliation layer.

In accordance with another aspect of the present invention, there is provided a wafer producing apparatus including: a holding unit adapted to hold a hexagonal single crystal ingot; a planarizing unit adapted to grind an upper surface of the hexagonal single crystal ingot held by the holding unit to planarize the upper surface; an exfoliation layer forming unit adapted to apply a laser beam of such a wavelength as to be transmitted through the hexagonal single crystal ingot to the hexagonal single crystal ingot held by the holding unit, with a focal point of the laser beam positioned at a depth corresponding to a thickness of a wafer to the produced from an upper surface of the hexagonal single crystal ingot, to form an exfoliation layer; a production history forming unit adapted to apply a laser beam of such a wavelength as to be transmitted through the hexagonal single crystal ingot to the hexagonal single crystal ingot, with a focal point of the laser beam positioned in an inside of a region not to be formed with devices of a wafer to be produced, to form a production history; a wafer exfoliating unit adapted to hold the upper surface of the hexagonal single crystal ingot and exfoliate the wafer from the exfoliation layer; and a wafer accommodating unit adapted to accommodate the exfoliated wafer.

According to the wafer producing method of the present invention, the history of the wafer exfoliated from the hexagonal single crystal ingot is formed in the inside of the wafer, and it is possible, even in the process of device formation, to confirm the history of the wafer. Therefore, in the case where a defect is generated in a device, it is possible to trace back the history of the wafer, and to investigate the cause of the defect in the device, leading to prevention of recurrence of the defect. Further, even after the wafer is exfoliated from the hexagonal single crystal ingot, the hexagonal single crystal ingot can be specified by the production history formed in the first production history forming step.

According to the wafer producing apparatus of the present invention, the history of the wafer exfoliated from the hexagonal single crystal ingot is formed in the inside of the wafer, and, therefore, it is possible, even in the process of device formation, to confirm the history of the wafer. In the case where a defect is generated in a device, it is possible to trace back the history of the wafer, and to investigate the cause of the defect in the device, leading to prevention of recurrence of the defect. In addition, since the wafer producing method as above-mentioned can be carried out, it is possible, even after the wafer is exfoliated from the hexagonal single crystal ingot, to specify the hexagonal single crystal ingot by the production history formed in the first production history forming step.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 12A is a perspective view of the hexagonal single crystal SiC ingot and a substrate;
FIG. 12B is a perspective view depicting a state in which the substrate is mounted to the hexagonal single crystal SiC ingot.

Figure 1:
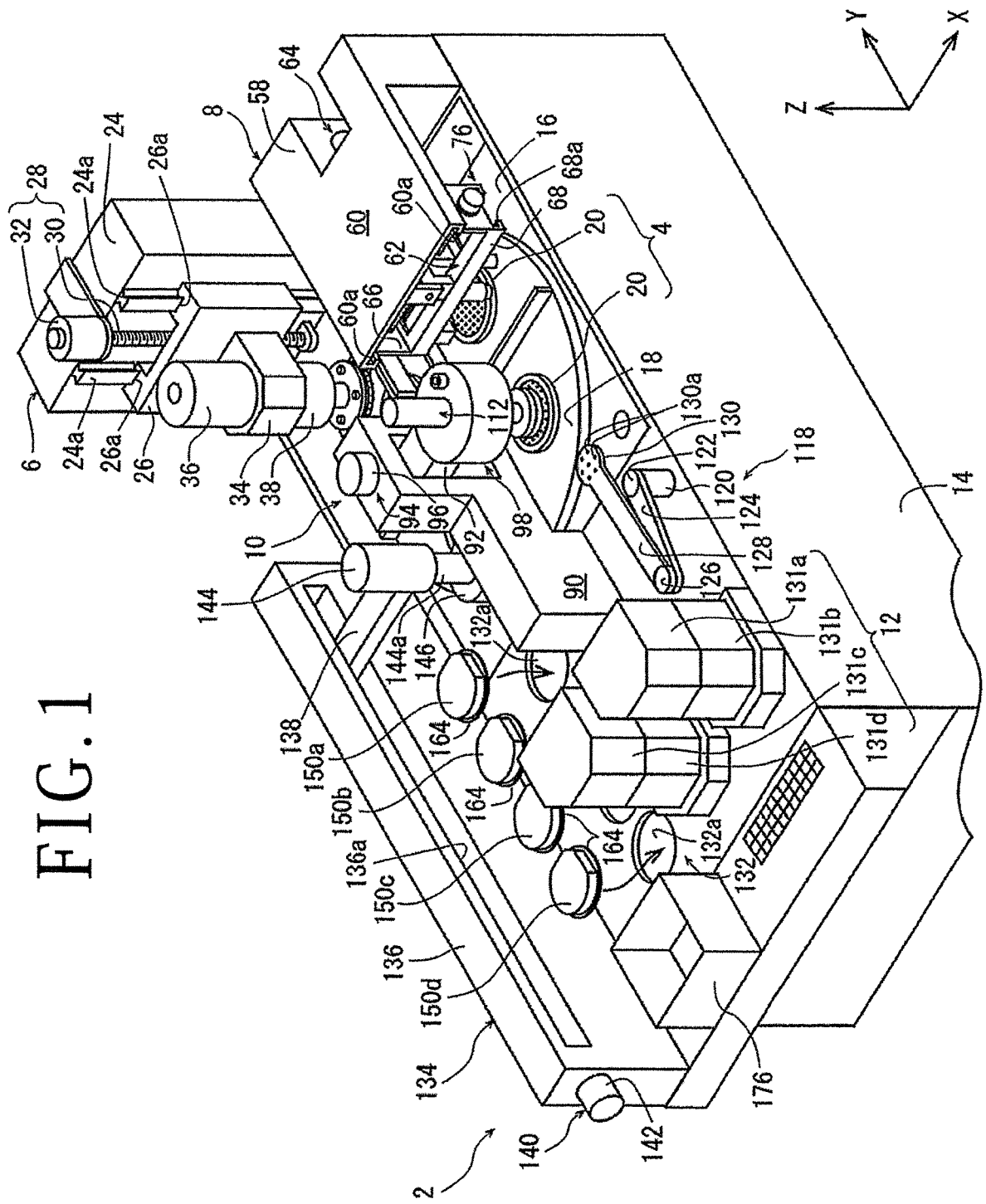
FIG. 1 is a perspective view of a wafer producing apparatus according to an embodiment of the present invention.

DETAILED DESCRIPTION OF THE
PREFERRED EMBODIMENT

An embodiment of a wafer producing method and a wafer producing apparatus according to the present invention will be described below, referring to the drawings. First, the wafer producing apparatus according to the present invention will be described. A wafer producing apparatus 2 illustrated in FIG. 1 includes: a holding unit 4 adapted to hold a hexagonal single crystal ingot (hereinafter referred to simply as ingot); a planarizing unit 6 adapted to grind an upper surface of the ingot held by the holding unit 4 to planarize the upper surface; an exfoliation layer forming unit adapted to apply a laser beam of such a wavelength as to be transmitted through the ingot to the ingot, with a focal point of the laser beam positioned at a depth corresponding to a thickness of a wafer to be produced from the upper surface of the ingot held by the holding unit 4, to form an exfoliation layer; a production history forming unit adapted to apply a laser beam of such a wavelength as to be transmitted through the ingot to the ingot, with a focal point of the laser beam positioned in an inside of a region not to be formed with devices of the wafer to be produced, to form a production history; a wafer exfoliating unit 10 adapted to hold the upper surface of the ingot and exfoliate the wafer from the exfoliation layer; and a wafer accommodating unit 12 adapted to accommodate the exfoliated wafer. While an example wherein the exfoliation layer forming unit and the production history forming unit are configured by use of the same laser applying unit 8 is described in the present embodiment, the exfoliation layer forming unit and the production history forming unit may be configured by use of different laser applying units.

The holding unit 4 will be described referring to FIG. 2. A base 14 of the wafer producing apparatus 2 is formed with a turntable accommodating section 16 recessed downward from an upper surface of the base 14, and a circular turntable 18 is rotatably accommodated in the turntable accommodating section 16. The turntable 18 is rotated around a rotational center constituted of an axis extending in a Z-axis direction and passing through a radial center of the turntable 18 by a turntable motor (not depicted) incorporated in the base 14. Besides, the holding unit 4 in the present embodiment includes four circular chuck tables 20 rotatably disposed on the upper surface of the turntable 18. With the turntable 18 rotated, each of the chuck tables 20 is positioned at a standby position P1, a planarization position P2 under the planarizing unit 6, a laser applying position P3 under the laser applying unit 8, and a wafer exfoliation position P4 under the wafer exfoliating unit 10. Each chuck table 20 is rotated around a rotational center constituted of an axis extending in the Z-axis direction and passing through a radial center of the chuck table 20 by each of four chuck table motors (not depicted) incorporated in the base 14. The four chuck tables 20 arranged at regular intervals (intervals of 90 degrees) along the circumferential direction of the turntable 18 are partitioned by a cross-shaped partition wall 18a disposed on the upper surface of the turntable 18. In addition, at the upper surface of each chuck table 20 is disposed a porous suction chuck 22 connected to suction means (not depicted).

Each chuck table 20 constituting the holding unit 4 can suction hold an ingot placed on the upper surface of the suction chuck 22, by generating a suction force at the upper surface of the suction chuck 22 by the suction means. Note that the Z-axis direction is the vertical direction indicated by arrow Z in FIG. 2. Besides, an X-axis direction indicated by arrow X in FIG. 2 is a direction orthogonal to the Z-axis direction, and a Y-axis direction indicated by arrow Y in FIG. 2 is a direction orthogonal to the X-axis direction and the Z-axis direction. A plane defined by the X-axis direction and the Y-axis direction is substantially horizontal.

Figure 2:
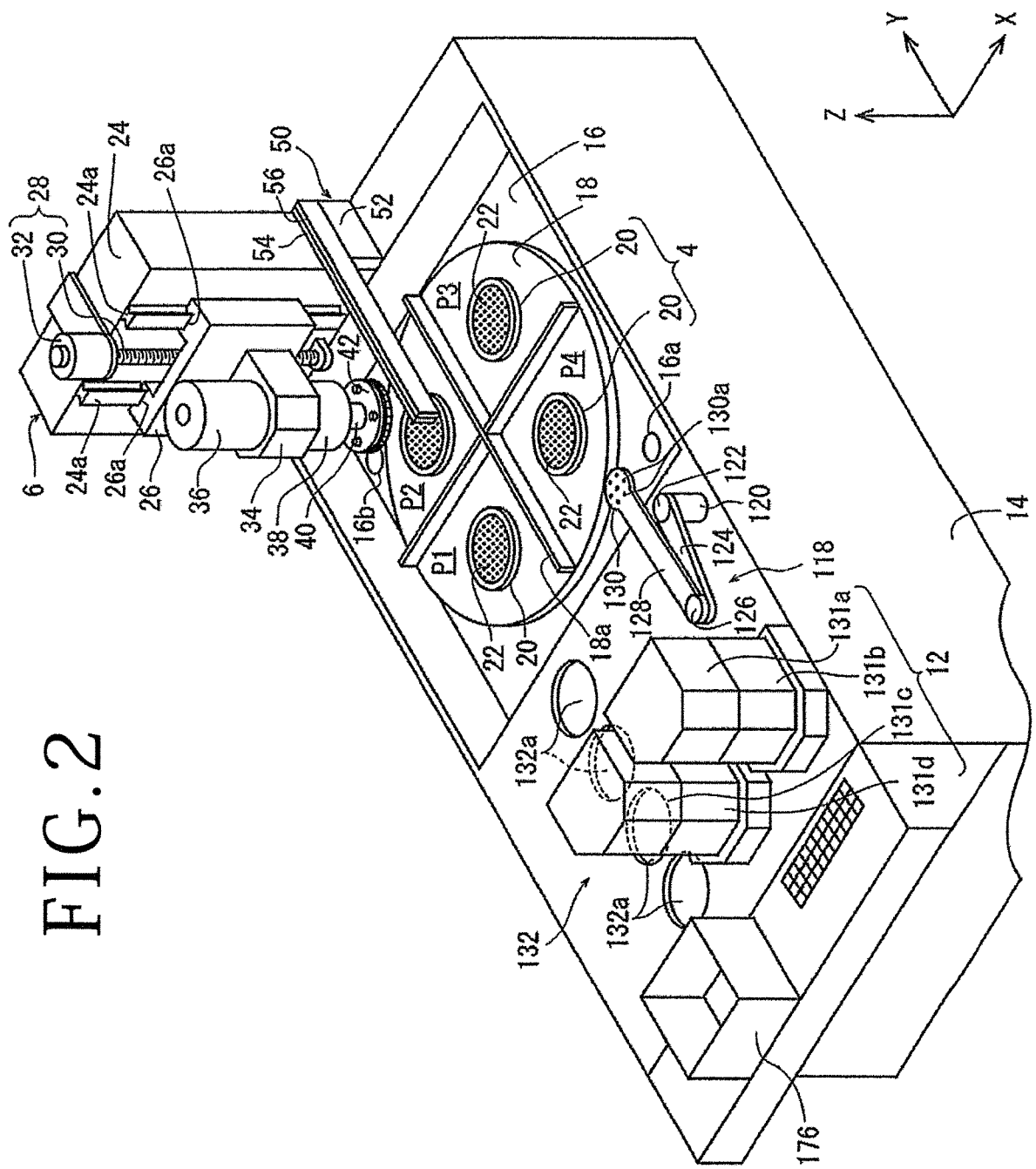
FIG. 2 is a major part perspective view of the wafer producing apparatus depicted in FIG. 1.

As illustrated in FIG. 2, the planarizing unit 6 includes a mounting wall 24 extending in the Z-axis direction from an upper surface of one end portion in the Y-axis direction of the base 14, a Z-axis direction movable plate 26 mounted to the mounting wall 24 such as to be movable in the Z-axis direction, and a Z-axis direction moving mechanism 28 adapted to move the Z-axis direction movable plate 26 in the Z-axis direction. On one side surface (a surface on the viewer's side in FIG. 2) of the mounting wall 24, a pair of guide rails 24a extending in the Z-axis direction are provided, with a spacing therebetween in the X-axis direction. The Z-axis movable plate 26 is formed with a pair of guided grooves 26a extending in the Z-axis direction, correspondingly to each of the guide rails 24a on the mounting wall 24. The guided rails 26a are engaged with the guide rails 24a, whereby the Z-axis direction movable plate 26 is mounted to the mounting wall 24 such as to be movable in the Z-axis direction. The Z-axis direction moving mechanism 28 includes a ball screw 30 extending in the Z-axis direction along one side surface of the mounting wall 24, and a motor 32 connected to one end portion of the ball screw 30. A nut section (not depicted) of the ball screw 30 is fixed to the Z-axis direction movable plate 26. Besides, the Z-axis direction moving mechanism 28 converts a rotational motion of the motor 32 into a rectilinear motion, and transmits the rectilinear motion to the Z-axis direction movable plate 26, by the ball screw 30, thereby moving the Z-axis direction movable plate 26 in the Z-axis direction along the guide rails 24a.

Figure 3:
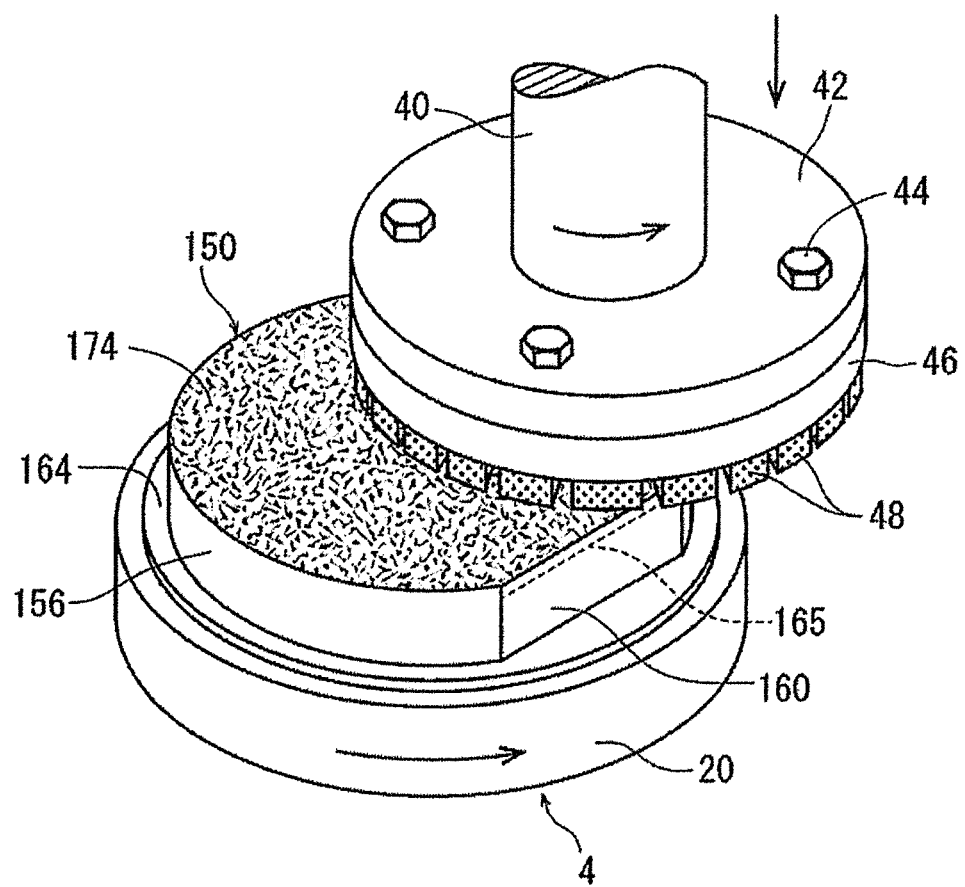
FIG. 3 is a major part enlarged perspective view of a planarizing unit depicted in FIG. 2.

Referring to FIG. 3 together with FIG. 2, the description of the planarizing unit 6 will be continued. A support block 34 projecting in the Y-axis direction is fixed to an outer surface of the Z-axis direction movable plate 26. A motor 36 is supported on an upper surface of the support block 34, and a spindle housing 38 extending downward is supported on a lower surface of the support block 34. A cylindrical spindle 40 is supported on the spindle housing 38 in such a manner as to be rotatable around an axis extending in the Z-axis direction. An upper end of the spindle 40 is connected to the motor 36, and the spindle 40 is rotated around the axis extending in the Z-axis direction by the motor 36. As depicted in FIG. 3, a circular disk-shaped wheel mount 42 is fixed to a lower end of the spindle 40, and an annular grinding wheel 46 is fixed to a lower surface of the wheel mount 42 by bolts 44. At an outer peripheral edge portion of a lower surface of the grinding wheel 46, there are fixed a plurality of grindstones 48 arranged in an annular pattern at intervals in the circumferential direction. As illustrated in FIG. 3, a rotational center of the grinding wheel 46 is deviated from a rotational center of the chuck table 20, such that the grindstones 48 pass through the rotational center of the chuck table 20 positioned at the planarization position P2. Therefore, in the planarizing unit 6, when the upper surface of the ingot held by the chuck table 20 and the grindstones 48 make contact with each other while the chuck table 20 and the grinding wheel 46 are mutually rotated, the upper surface of the ingot can be as a whole ground by the grindstones 48, and, accordingly, the upper surface of the ingot held by the chuck table 20 can be ground and planarized.

Figure 4:
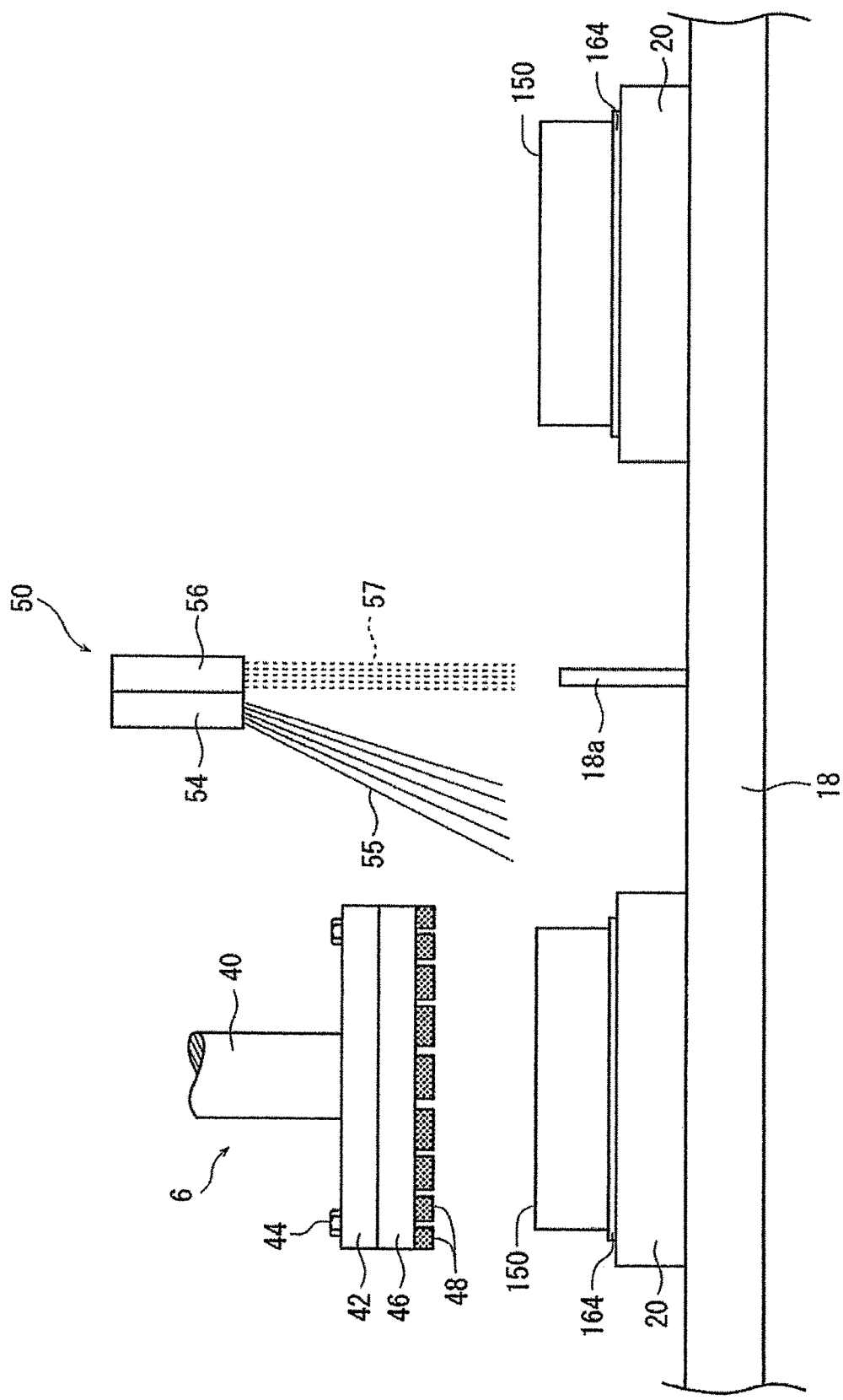
FIG. 4 is a schematic view depicting a state in which cleaning water is jetted from a first cleaning section of a cleaning unit and drying air is jetted from a second cleaning section.

The wafer producing apparatus 2 further includes a cleaning unit 50 adapted to clean the ingot planarized by the planarizing unit 6. As depicted in FIG. 2, the cleaning unit 50 includes: a support body 52 mounted on the upper surface of the base 14 along a side surface of the mounting wall 24 of the planarizing unit 6; a first cleaning section 54 extending in the Y-axis direction from an upper portion of the support body 52; and a second cleaning section 56 extending in the Y-axis direction from an upper portion of the support body 52 in the state of being aligned with the first cleaning section 54. A lower surface of the first cleaning section 54 which can be formed from a hollow member is formed with a plurality of jet holes (not depicted) at intervals in the Y-axis direction, and the first cleaning section 54 is connected to cleaning water supplying means (not depicted). In addition, a lower surface of the second cleaning section 56 which can be formed from a hollow member is also formed with a plurality of jet holes (not depicted) at intervals in the Y-axis direction, and the second cleaning section 56 is connected to a compressed air source (not depicted). As illustrated in FIG. 4, the cleaning unit 50 has a configuration wherein cleaning water 55 is obliquely jetted downward from each of the jet holes of the first cleaning section 54 to the planarizing unit 6 side, whereby grinding swarf can be removed from the ingot, and the ingot planarized by the planarizing unit 6 can be cleaned. In addition, the cleaning unit 50 has a configuration wherein drying air 57 is jetted downward from each of jet holes of the second cleaning section 56, whereby the cleaning water 55 can be removed from the ingot, and the ingot can be dried.

Figure 5:
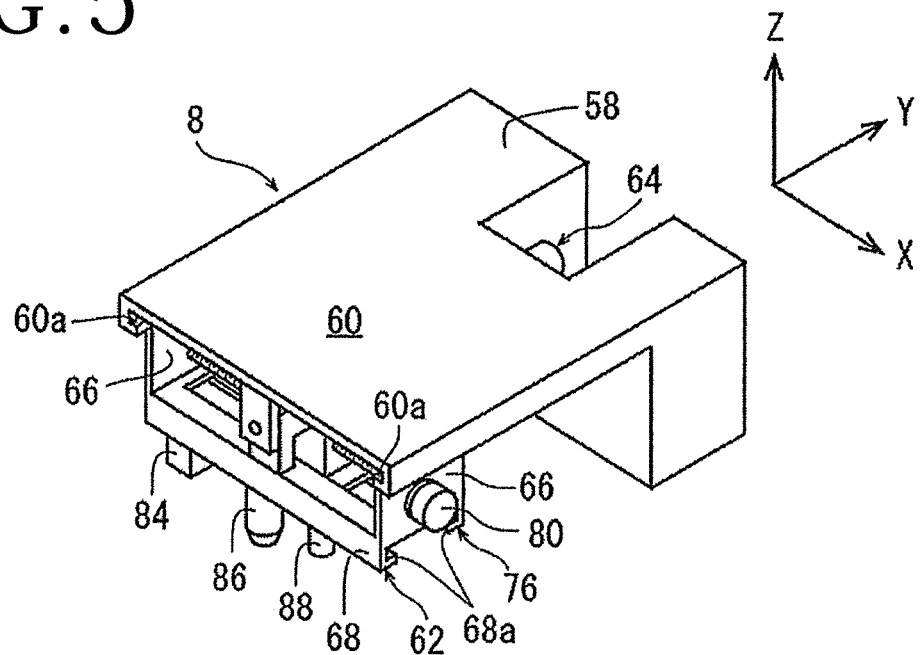
FIG. 5 is a perspective view of a laser applying unit depicted in FIG. 1.
Figure 6:
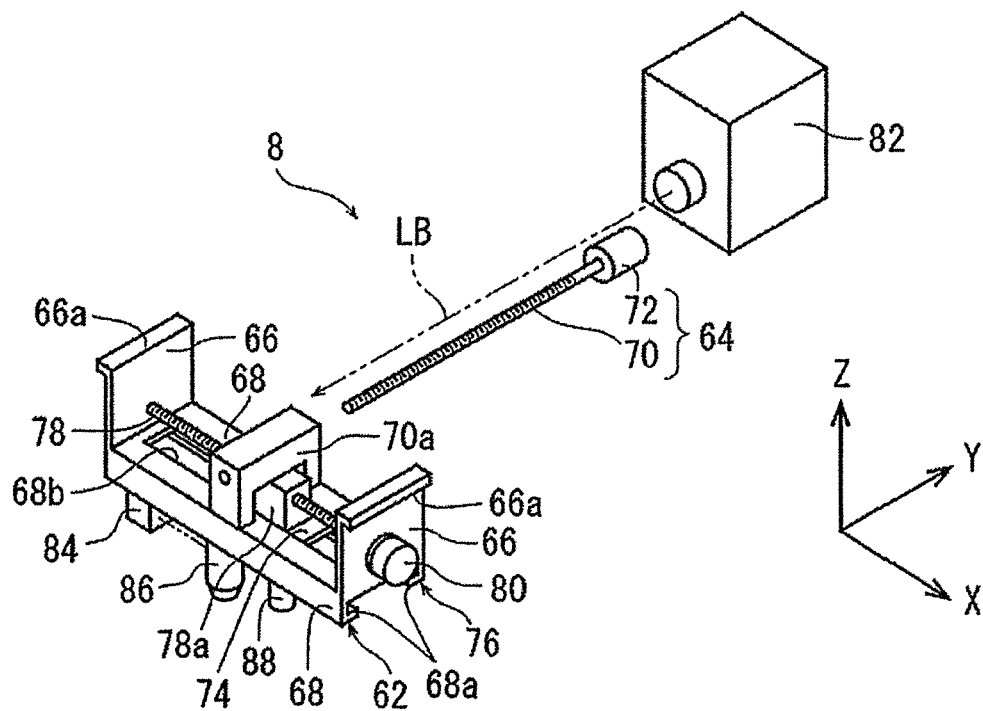
FIG. 6 is a perspective view of the laser applying unit in a state in which a frame body is omitted from the laser applying unit depicted in FIG. 5.

Referring to FIGS. 1, 5 and 6, the laser applying unit 8 constituting the exfoliation layer forming unit and the production history forming unit will be described. The laser applying unit 8 includes: a frame body 58 extending upward from the upper surface of the base 14 in the state of being aligned with the mounting wall 24 of the planarizing unit 6; a guide plate 60 extending in the Y-axis direction from an upper portion of the frame body 58; a Y-axis direction movable member 62 supported by the guide plate 60 such as to be movable in the Y-axis direction; and a Y-axis direction moving mechanism 64 adapted to move the Y-axis direction movable member 62 in the Y-axis direction. At lower portions of both ends in regard of the X-axis direction of the guide plate 60, a pair of guide rails 60*a* extending in the Y-axis direction are formed. As depicted in FIG. 6, the Y-axis direction movable member 62 includes a pair of guided sections 66 disposed with a spacing therebetween in the X-axis direction, and a mounting section 68 bridgingly arranged between lower ends of the guided sections 66 and extending in the X-axis direction. A guided rail 66*a* extending in the Y-axis direction is formed at an upper portion of each guided section 66. The guided rails 66*a* are engaged with guide rails 60*a*, whereby the Y-axis direction moving member 62 is supported on the guide plate 60 such as to be movable in the Y-axis direction. In addition, at lower portions of both ends in regard of the Y-axis direction of the mounting section 68, a pair of guide rails 68*a* extending in the X-axis direction are formed. As illustrated in FIG. 6, the Y-axis direction moving mechanism 64 includes a ball screw 70 extending in the Y-axis direction under the guide plate 60, and a motor 72 connected to one end portion of the ball screw 70. A gate-formed nut section 70*a* of the ball screw 70 is fixed to an upper surface of the mounting section 68. The Y-axis direction moving mechanism 64 convers a rotational motion of the motor 72 into a rectilinear motion, and transmits the rectilinear motion to the Y-axis direction movable member 62, by the ball screw 70, thereby moving the Y-axis direction movable member 62 in the Y-axis direction along the guide rails 60*a*.

The description of the laser applying unit 8 will be continued referring to FIG. 6. The laser applying unit 8 further includes an X-axis direction movable plate 74 mounted to the mounting section 68 such as to be movable in the X-axis direction, and an X-axis direction moving mechanism 76 adapted to move the X-axis direction movable plate 74 in the X-axis direction. Both end portions in regard of the Y-axis direction of the X-axis direction movable plate 74 are engaged with the guide rails 68*a* of the mounting section 68, whereby the X-axis direction movable plate 74 is mounted to the mounting section 68 such as to be movable in the X-axis direction. The X-axis direction moving mechanism 76 includes a ball screw 78 extending in the X-axis direction on the upper side of the mounting section 68, and a motor 80 connected to one end portion of the ball screw 78. A nut section 78*a* of the ball screw 78 is passed through an opening 68*b* of the mounting section 68 and fixed to an upper surface of the X-axis direction movable plate 74. The X-axis direction moving mechanism 76 converts a rotational motion of the motor 80 into a rectilinear motion, and transmits the rectilinear motion to the X-axis direction movable plate 74, by the ball screw 78, thereby moving the X-axis direction movable plate 74 in the X-axis direction along the guide rails 68*a*.

Figure 7:
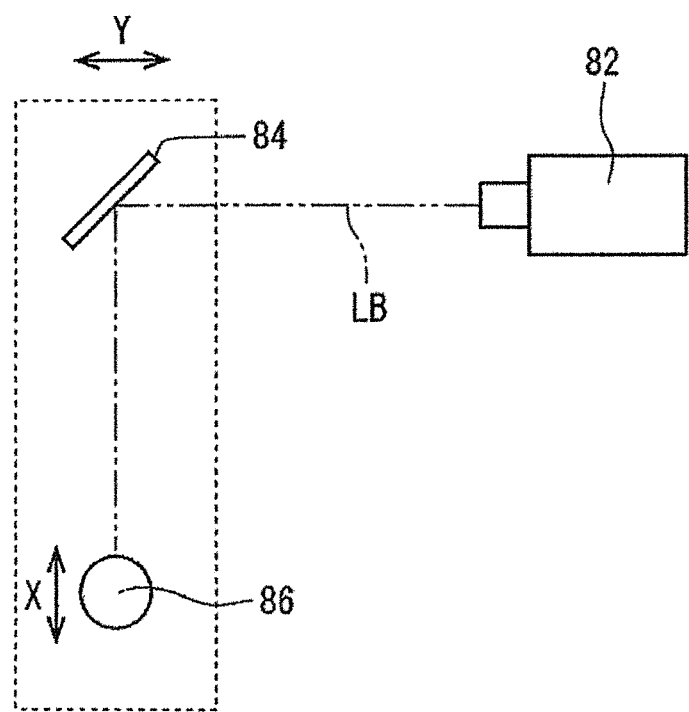
FIG. 7 is a block diagram of the laser applying unit depicted in FIG. 5.

The description of the laser applying unit 8 will be continued referring to FIGS. 6 and 7. The laser applying unit 8 further includes: a laser oscillator 82 incorporated in the frame body 58; an attenuator (not depicted) adapted to control the output of a pulsed laser beam LB emitted from the laser oscillator 82; a first mirror 84 mounted to a lower surface of the mounting section 68 in the state of being spaced from the laser oscillator 82 in the Y-axis direction; a focusing device 86 mounted to a lower surface of the X-axis direction movable plate 74 such as to be movable in the Z-axis direction; a second mirror (not depicted) mounted on the lower surface of the X-axis direction movable plate 74 directly above the focusing device 86 in the state of being spaced from the first mirror 84 in the X-axis direction; an alignment unit 88 mounted to the lower surface of the X-axis direction movable plate 74 in the state of being spaced from the focusing device 86 in the X-axis direction; and focal point position control means (not depicted) moving the focusing device 86 in the Z-axis direction to control the Z-axis directional position of the focal point of the focusing device 86. The laser oscillator 82 is adapted to oscillate the pulsed laser beam LB of such a wavelength as to be transmitted through the ingot. The focusing device 86 has a focusing lens (not depicted) adapted to focus the pulsed laser beam LB emitted from the laser oscillator 82, and the focusing lens is located under the second mirror.

The alignment unit 88 images the ingot held by the chuck table 20, to detect a region to be laser processed. The focal point position control means may be configured, for example, to include a ball screw (not depicted) of which a nut section is fixed to the focusing device 86 and which extends in the Z-axis direction, and a motor (not depicted) connected to one end portion of the ball screw. The focal point position control means having such a configuration convers a rotational motion of the motor into a rectilinear motion, and transmits the rectilinear motion to the focusing device 86, by the ball screw, thereby controlling the Z-axis directional position of the focal point of the pulsed laser beam LB focused by the focusing lens. The pulsed laser beam LB emitted from the laser oscillator 82 with an optical path set in the Y-axis direction, is controlled to an appropriate output by the attenuator, is then changed in the optical path from the Y-axis direction into the X-axis direction by the first mirror 84, to be led to the second mirror, is subsequently changed in the optical path from the X-axis direction into the Z-axis direction by the second mirror, to be led to the focusing lens of the focusing device 86, and is thereafter focused by the focusing lens, to be applied to the ingot held by the chuck table 20.

In addition, both in the case where the focusing device 86 is moved in the Y-axis direction by moving the Y-axis direction movable member 62 by the Y-axis direction moving mechanism 64 and in the case where the focusing device 86 is moved in the X-axis direction by moving the X-axis direction movable plate 74 by the X-axis direction moving mechanism 76, the pulsed laser beam LB emitted from the laser oscillator 82 in parallel to the Y-axis direction is changed in optical path from the Y-axis direction into the X-axis direction by the first mirror 84, to be led to the second mirror, and the pulsed laser beam LB led to the second mirror is changed in optical path from the X-axis direction into the Z-axis direction by the second mirror, to be led to the focusing device 86. In the laser applying unit 8 configured as above, the ingot held by the chuck table 20 is imaged by the alignment unit 88 to detect a region to be laser processed, and then the pulsed laser beam LB of such a wavelength as to be transmitted through the ingot is applied to the ingot held by the chuck table 20, with a focal point of the pulsed laser beam LB positioned at a depth corresponding to the thickness of the wafer to be produced from an upper surface of the ingot held by the chuck table 20 by moving the focusing device 86 in the Z-axis direction by the focal point position control means, and while appropriately moving the X-axis direction movable plate 74 by the X-axis direction moving mechanism 76 and appropriately moving the Y-axis direction movable member 62 in the Y-axis direction by the Y-axis direction moving mechanism 64, whereby an exfoliation layer can be formed in the inside of the ingot and a production history can be formed in the inside of the ingot.

Figure 8:
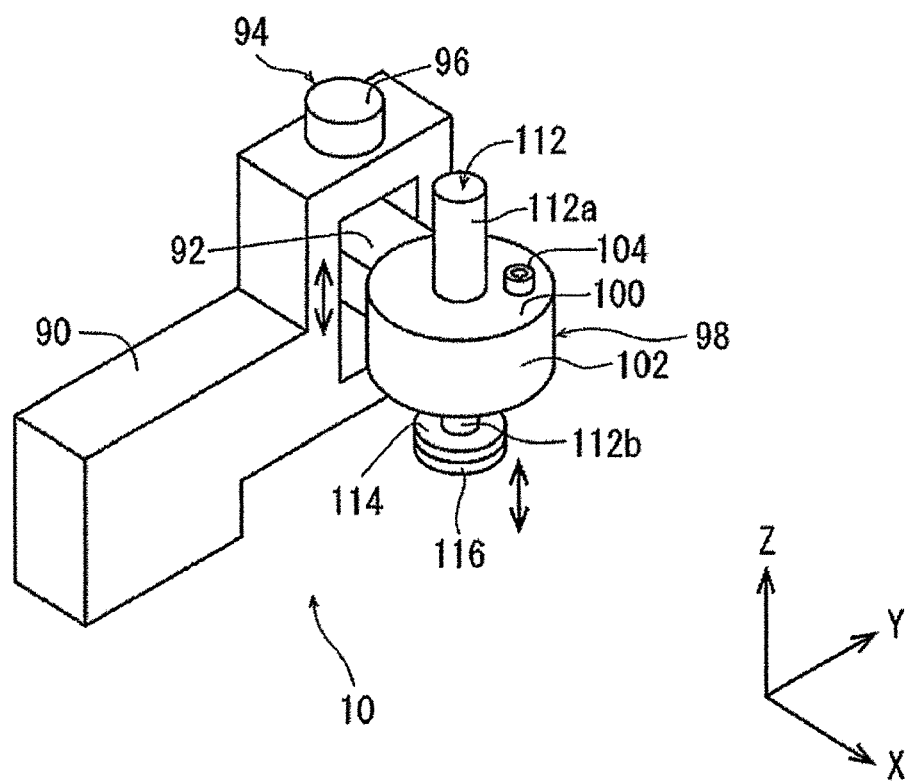
FIG. 8 is a perspective view of a wafer exfoliating unit depicted in FIG. 1.

Referring to FIGS. 1 and 8, the wafer exfoliating unit 10 will be described. The wafer exfoliating unit 10 includes a support body 90 fixed to the upper surface of the base 14, an arm 92 extending in the X-axis direction from its base end portion supported on the support body 90 such as to be movable in the Z-axis direction, and an arm moving mechanism 94 adapted to move the arm 92 in the Z-axis direction. The arm moving mechanism 94 includes a ball screw (not depicted) extending in the Z-axis direction in the inside of the support body 90, and a motor 96 connected to one end portion of the ball screw. A nut section (not depicted) of the ball screw of the arm moving mechanism 94 is fixed to the base end portion of the arm 92. The arm moving mechanism 94 converts a rotational motion of the motor 96 into a rectilinear motion, and transmits the rectilinear motion to the arm 92, by the ball screw, thereby moving the arm 92 in the Z-axis direction along guide rails (not depicted) incorporated in the support body 90 and extending in the Z-axis direction.

Figure 9:
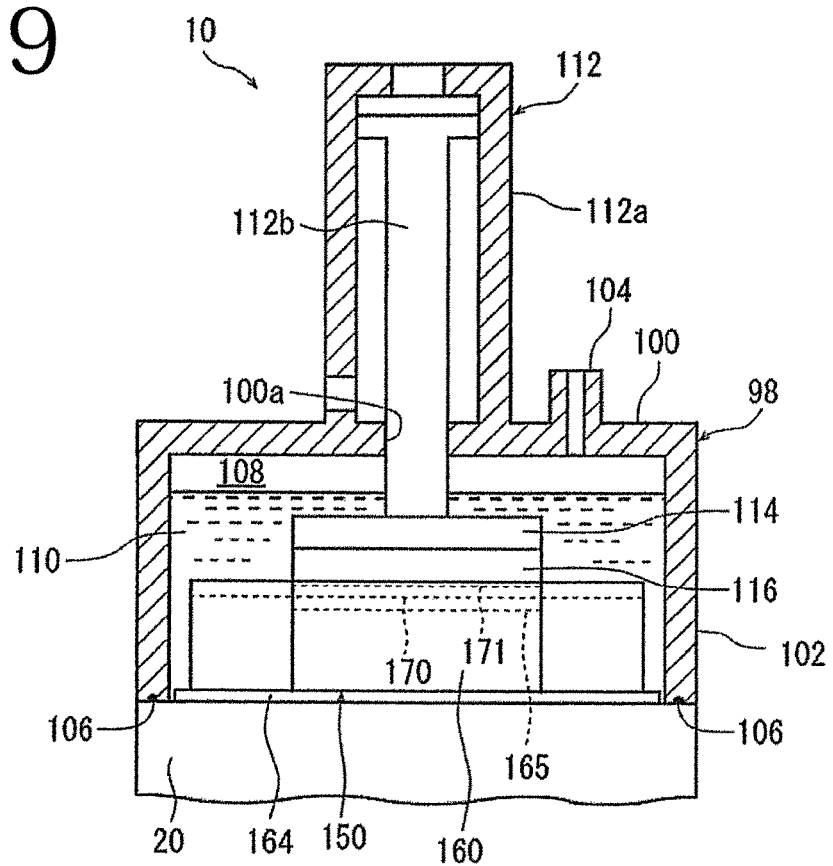
FIG. 9 is a sectional view of the wafer exfoliating unit depicted in FIG. 1.

The description of the wafer exfoliating unit 10 will be continued referring to FIGS. 8 and 9. To a tip portion of the arm 92 is fixed a liquid tank 98 that accommodates a liquid in cooperation with the chuck table 20 when exfoliating the wafer from the ingot. The liquid tank 98 includes a circular top wall 100, and a cylindrical side wall 102 drooping from a peripheral edge of the top wall 100, and is opened on a lower end side. The outside diameter of the side wall 102 is not more than the diameter of the chuck table 20, such that, when the arm 92 is lowered, a lower end of the side wall 102 comes into contact with an upper surface of the chuck table 20. The top wall 100 is additionally provided with a cylindrical liquid supply section 104 providing communication between the outside and the inside of the liquid tank 98. The liquid supply section 104 is connected to liquid supply means (not depicted). As depicted in FIG. 9, an annular packing 106 is additionally provided at a lower end of the side wall 102. When the arm 92 is lowered by the arm moving mechanism 94 to cause the lower end of the side wall 102 to make contact with the upper surface of the chuck table 20, a liquid accommodating space 108 is defined by the upper surface of the chuck table 20 and an inner surface of the liquid tank 98. A liquid 110 supplied from the liquid supply means into the liquid accommodating space 108 through the liquid supply section 104 is prevented by the packing 106 from leaking out of the liquid accommodating space 108.

The description of the wafer exfoliating unit 10 will be further continued referring to FIGS. 8 and 9. An air cylinder 112 is mounted to the top wall 100 of the liquid tank 98. A cylinder tube 112a of the air cylinder 112 extends upward from an upper surface of the top wall 100. As illustrated in FIG. 9, a lower end portion of a piston rod 112b of the air cylinder 112 projects to the lower side of the top wall 100 by passing through a penetrating opening 100a of the top wall 100. A circular disk-shaped ultrasonic vibration generating member 114 which can be formed from a piezoelectric ceramic or the like is fixed to the lower end portion of the piston rod 112b. A circular disk-shaped suction piece 116 is fixed to a lower surface of the ultrasonic vibration generating member 114. The suction piece 116, formed with a plurality of suction holes (not depicted) in a lower surface thereof, is connected to suction means (not depicted). With a suction force generated at the lower surface of the suction piece 116 by the suction means, the suction piece 116 can hold the ingot by suction. In the wafer exfoliating unit 10, the arm 92 is lowered by the arm moving mechanism 94, the lower end of the side wall 102 is put into close contact with the upper surface of the chuck table 20 supporting the ingot formed with the exfoliation layer by the laser applying unit 8, the piston rod 112b of the air cylinder 112 is lowered, and the suction piece 116 is put into contact with the upper surface of the ingot under suction; then, in this state, the liquid 110 is accommodated in the liquid accommodating space 108, after which the ultrasonic vibration generating member 114 is operated to apply ultrasonic vibration to the ingot, whereby the wafer can be exfoliated from the ingot, with the exfoliation as a starting point of exfoliation.

The wafer accommodating unit 12 will be described referring to FIGS. 1 and 2. The wafer accommodating unit 12 includes at least one cassette in which a plurality of wafers exfoliated from the ingot by the wafer exfoliating unit 10 can be accommodated at intervals in the vertical direction. In the case where a plurality of cassettes are used, the same cassette can be used. In the present embodiment, the wafer accommodating unit 12 includes four cassettes, namely, a first cassette 131a, a second cassette 131b, a third cassette 131c, and a fourth cassette 131d. In addition, a wafer carrying unit 118 by which the wafer exfoliated from the ingot is carried from the wafer exfoliating unit 10 to the wafer accommodating unit 12 is disposed between the wafer exfoliating unit 10 and the wafer accommodating unit 12. As illustrated in FIGS. 1 and 2, the wafer carrying unit 118 includes: lift means 120 extending upward from the upper surface of the base 14; a first motor 122 fixed to a tip of the lift means 120; a first arm 124 having a base end portion rotatably connected to the first motor 122; a second motor 126 fixed to a tip portion of the first arm 124; a second arm 128 having a base end portion rotatably connected to the second motor 126; and a suction piece 130 fixed to a tip portion of the second arm 128. The first motor 122, which is lifted up and down in the Z-axis direction by the lift means 120, rotates the first arm 124 around a rotational center constituted of an axis extending in the Z-axis direction by passing through the base end portion of the first arm 124, relative to the lift means 120. The second motor 126 rotates the second arm 128 around an axis extending in the Z-axis direction by passing through the base end portion of the second arm 128, relative to the first arm 124. The suction piece 130, formed with a plurality of suction holes 130a in an upper surface thereof, is connected to suction means (not depicted). With a suction force generated at the upper surface of the suction piece 130 by the suction means, the wafer carrying unit 118 can suction hold the wafer, exfoliated from the ingot by the wafer exfoliating unit 10, by the suction piece 130, and can carry the wafer suction held by the suction piece 130 from the wafer exfoliating unit 10 to the wafer accommodating unit 12 by operating the first arm 124 and the second arm 128 by the lift means 120, the first motor 122 and the second motor 126.

As depicted in FIG. 1, the wafer producing apparatus 2 further includes an ingot accommodating unit 132 in which to accommodate the ingot, and an ingot carrying unit 134 adapted to carry the ingot from the ingot accommodating unit 132 to the holding unit 4. The ingot accommodating unit 132 in the present embodiment includes four circular accommodating recesses 132a formed in the upper surface of the base 14 at intervals in the Y-axis direction. The ingots are accommodated respectively in the four accommodating recesses 132a of which the diameter is slightly larger than the diameter of the ingots.

Figure 10:
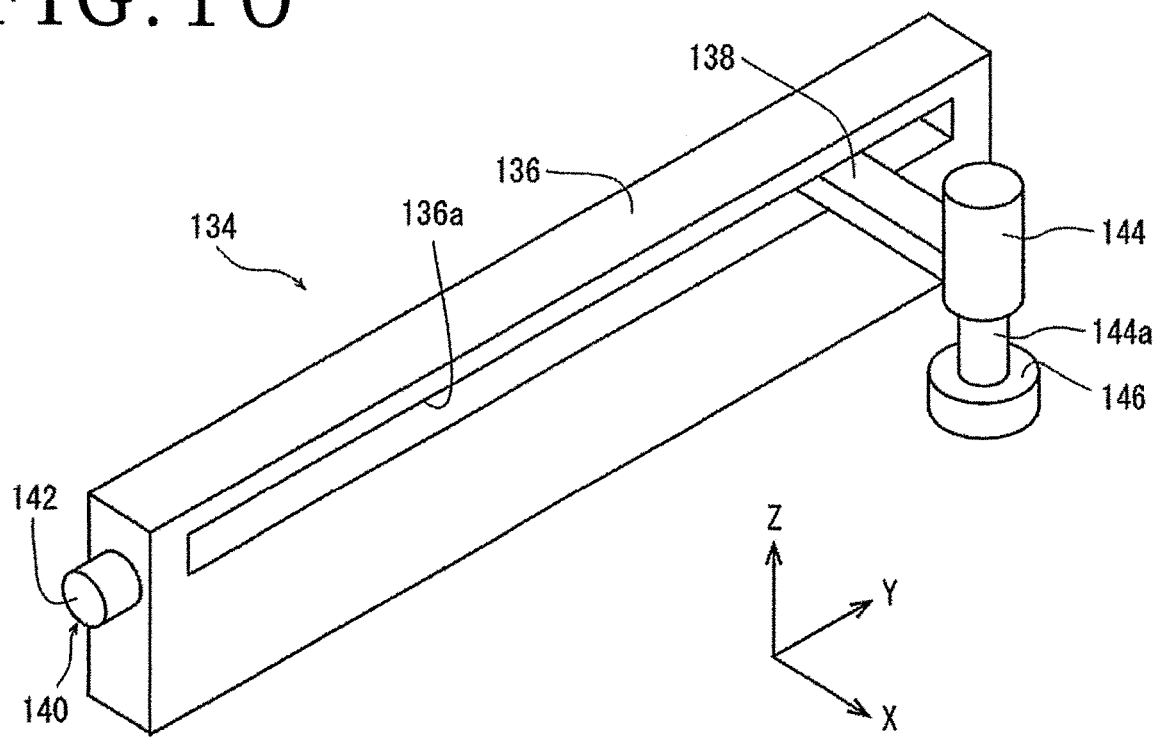
FIG. 10 is a perspective view of an ingot carrying unit depicted in FIG. 1.

Referring to FIGS. 1 and 10, the ingot carrying unit 134 will be described. The ingot carrying unit 134 includes: a frame body 136 extending in the Y-axis direction along the ingot accommodating unit 132 on the upper surface of the base 14; an arm 138 extending in the X-axis direction from its base end portion rotatably supported by the frame body 136 such as to be movable in the Y-axis direction; and an arm moving mechanism 140 adapted to move the arm 138 in the Y-axis direction. The frame body 136 is formed with a guide opening 136a extending in the Y-axis direction. The arm moving mechanism 140 includes a ball screw (not depicted) extending in the Y-axis direction in the inside of the frame body 136, and a motor 142 connected to one end portion of the ball screw. A nut section (not depicted) of the ball screw of the arm moving mechanism 140 is fixed to a base end portion of the arm 138. The arm moving mechanism 140 converts a rotational motion of the motor 142 into a rectilinear motion, and transmits the rectilinear motion to the arm 138, thereby moving the arm 138 in the Y-axis direction along the guide opening 136a. As depicted in FIG. 10, an air cylinder 144 extending in the Z-axis direction is mounted to a tip portion of the arm 138, and a suction piece 146 is fixed to a lower end portion of a piston rod 144a of the air cylinder 144. The suction piece 146, formed with a plurality of suction holes (not depicted) in a lower surface thereof, is connected to suction means (not depicted). With a suction force generated at the lower surface of the suction piece 146 by the suction means, the ingot carrying unit 134 can suction hold an upper surface of the ingot accommodated in the ingot accommodating unit 132 by the suction piece 146, and, by moving the arm 138 by the arm moving mechanism 140 and moving the suction piece 146 by the air cylinder 144, the ingot carrying unit 134 can carry the ingot held by the suction piece 146 from the ingot accommodating unit 132 to the holding unit 4.

Figure 11A:
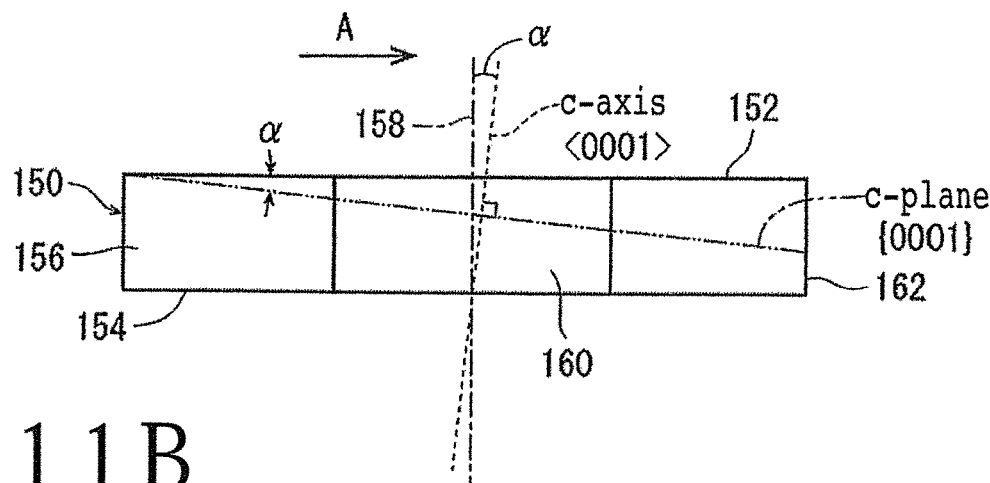
FIG. 11A is a front view of a hexagonal single crystal SiC ingot.
Figure 11B:
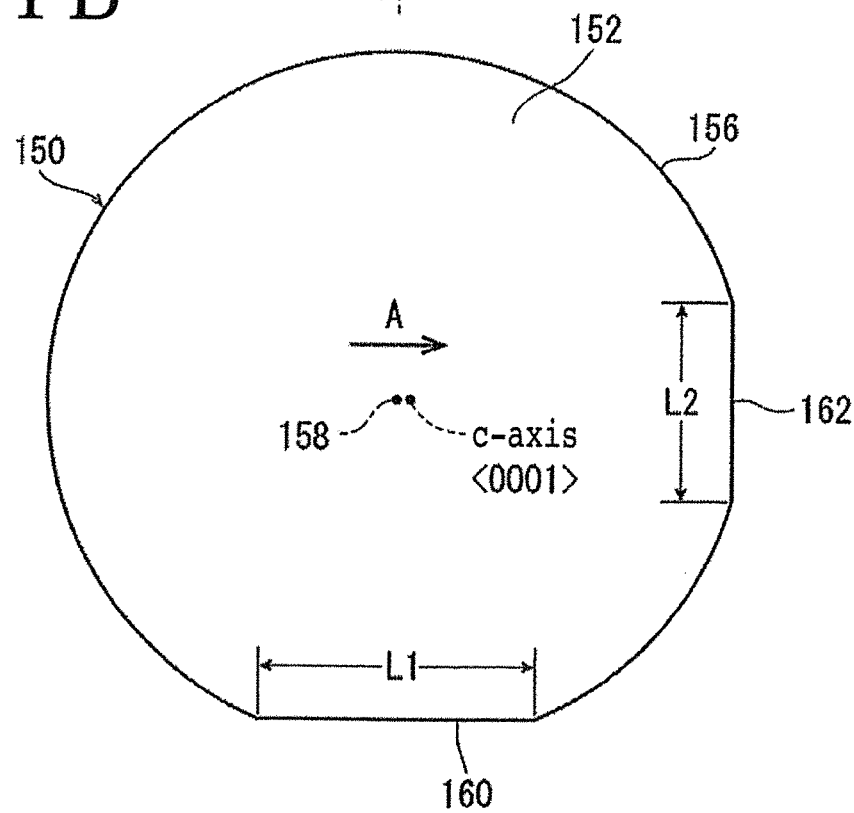
FIG. 11B is a plan view of the hexagonal single crystal SiC ingot.

FIGS. 11A and 11B depict an ingot 150 which can be processed by the wafer producing apparatus 2 as aforementioned. The ingot 150 in the present embodiment is formed in a cylindrical shape as a whole from hexagonal single crystal SiC, and has a circular first surface 152, a circular second surface 154 opposite to the first surface 152, a peripheral surface 156 located between the first surface 152 and the second surface 154, a c-axis (<0001> direction) extending from the first surface 152 to the second surface 154, and a c-plane ({0001} plane) orthogonal to the c-axis. In the ingot 150, the c-axis is inclined relative to a perpendicular 158 to the first surface 152, and an off angle α (for example, α=1, 3, or 6 degrees) is formed by the c-plane and the first surface 152. The direction in which the off angle α is formed is indicated by arrow A in FIGS. 11A and 11B. In addition, the peripheral surface 156 of the ingot 150 is formed with a rectangular first orientation flat 160 and a rectangular second orientation flat 162 for indicating a crystal orientation. The first orientation flat 160 is parallel to the direction A in which the off angle α is formed, while the second orientation flat 162 is orthogonal to the direction A in which the off angle α is formed. As depicted in FIG. 11B, as viewed from above, a length L2 of the second orientation flat 162 is shorter than a length L1 of the first orientation flat 160 (L2<L1). Note that the ingot to be processed by the wafer producing apparatus 2 is not limited to the above-mentioned ingot 150; for example, the ingot may be a hexagonal single crystal SiC ingot wherein the c-axis is not inclined relative to the perpendicular to the first surface, and the off angle between the c-plane and the first surface is zero degrees (or the perpendicular to the first surface and the c-axis are coincident), or may be a hexagonal single crystal ingot formed from a material other than hexagonal single crystal SiC, such as GaN (gallium nitride).

The wafer producing method according to the present invention will now be described below. In the present embodiment, the wafer producing method using the wafer producing apparatus 2 as aforementioned will be described. In the present embodiment, first, four ingots 150 are prepared, and a substrate mounting step is carried out wherein circular substrates 164 are mounted to lower surfaces (in the present embodiment, the second surfaces 154) of the prepared ingots 150 through an appropriate adhesive, as depicted in FIGS. 12A and 12B. The substrate mounting step is performed for holding the ingot 150 formed with the first orientation flat 160 and the second orientation flat 162 with a predetermined suction force by the circular suction chuck 22 of the chuck table 20. The diameter of the substrate 164 is slightly larger than the diameter of the ingot 150, and is slightly larger than the diameter of the suction chuck 22 of the chuck table 20. When the ingot 150 is placed on the chuck table 20, with the substrate 164 directed downward, the suction chuck 22 is covered by the substrate 164; therefore, when the suction means connected to the suction chuck 22 is operated, the substrate 164 is sucked with a predetermined suction force by the suction chuck 22, whereby the ingot 150 formed with the first orientation flat 160 and the second orientation flat 162 can be held by the chuck table 20. Note that in the case where the diameter of the ingot is larger than that of the suction chuck 22 so that the upper surface of the suction chuck 22 is wholly covered with the ingot when the ingot is placed on the chuck table 20, sucking-in of air through an exposed part of the suction chuck 22 does not occur at the time of suction by the chuck table 22, and the ingot can be sucked with a predetermined suction force by the suction chuck 22, and, therefore, the substrate mounting step may not necessarily be carried out.

After the substrate mounting step is conducted, an ingot accommodating step is carried out in which the ingots 150 are accommodated in the ingot accommodating unit 132. In the present embodiment, as depicted in FIG. 1, in the ingot accommodating step, the four ingots 150 are accommodated in the four accommodating recesses 132a of the ingot accommodating unit 132, with the substrates 164 directed downward. Note that in the following description, the four ingots 150 will be referred to as a first ingot 150a, a second ingot 150b, a third ingot 150c and a fourth ingot 150d, in this order from the ingot 150 accommodated in the accommodating recess 132a nearer to the turntable 18, for convenience. It is to be noted, however, where it is unnecessary to discriminate the ingots 150a to 150d from one another, they may be referred to simply as "the ingots 150".

Figure 13:
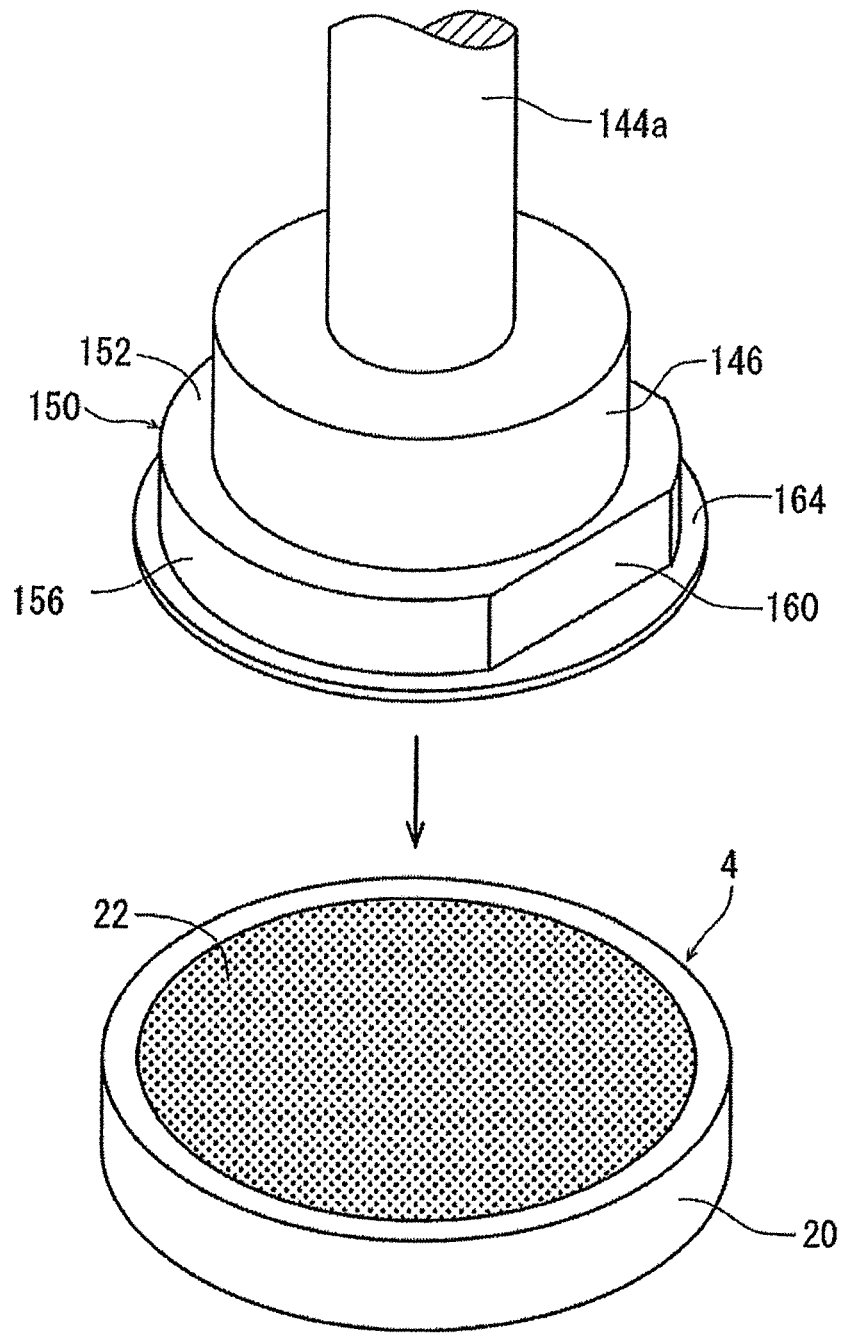
FIG. 13 is a perspective view depicting a state in which a holding step is carried out.

After the ingot accommodating step is conducted, an ingot carrying step is carried out wherein the ingot 150 is carried from the ingot accommodating unit 132 to the holding unit 4 by the ingot carrying unit 134. In the ingot carrying step, first, the arm 138 is moved by the arm moving mechanism 140 of the ingot carrying unit 134, and the suction piece 146 is positioned at a position on the upper side of the first ingot 150a accommodated in the ingot accommodating unit 132. Next, the suction piece 146 is lowered by the air cylinder 144 of the ingot carrying unit 134, and a lower surface of the suction piece 146 is put into close contact with an upper surface (in the present embodiment, the first surface 152) of the first ingot 150a. Subsequently, the suction means connected to the suction piece 146 is operated to generate a suction force at the lower surface of the suction piece 146, whereby the lower surface of the suction piece 146 is caused to suck the upper surface of the first ingot 150a. Next, the suction piece 146 sucking the first ingot 150a is moved upward by the air cylinder 144. Subsequently, the arm 138 is moved by the arm moving mechanism 140, and the suction piece 146 is positioned at a position on the upper side of the chuck table 20 positioned at the standby position P1. Subsequently, as depicted in FIG. 13, the suction piece 146 is lowered by the air cylinder 144, and the lower surface of the substrate 164 is put into contact with the upper surface of the chuck table 20 positioned at the standby position P1. Then, the operation of the suction means connected to the suction piece 146 is stopped to release the suction force at the suction piece 146, and the first ingot 150a is placed on the upper surface of the chuck table 20 positioned at the standby position P1. As a result, the first ingot 150a can be carried from the ingot accommodating unit 132 to the chuck table 20 constituting the holding unit 4 by the ingot carrying unit 134.

After the ingot carrying step is conducted, a holding step of holding the ingot 150 by the holding unit 4 is carried out. In the holding step, the suction means connected to the suction chuck 22 on which the first ingot 150a is placed is operated to generate a suction force at the upper surface of the suction chuck 22, and the first ingot 150a is suction held by the chuck table 20.

Figure 14:
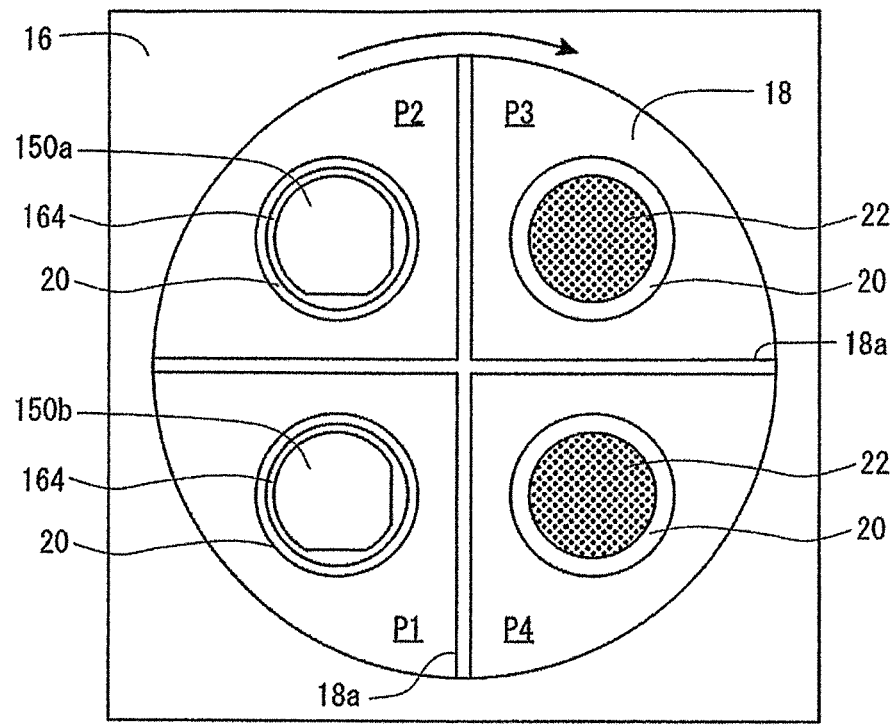
FIG. 14 is a plan view depicting a state in which a first ingot is positioned at a planarization position and a second ingot is positioned at a standby position.

After the holding step is performed, the turntable 18 is rotated by 90 degrees clockwise as viewed from above by a turntable motor, whereby the first ingot 150a is moved to the planarization position P2, as depicted in FIG. 14. For the first ingot 150a positioned at the planarization position P2, the planarization step of grinding the upper surface of the ingot 150 to planarize the upper surface may not necessary be performed at this stage. The ingot 150 normally has the first surface 152 and the second surface 154 planarized to such an extent as not to hamper the incidence of a laser beam in an exfoliation layer forming step to be described later, and, therefore, for the ingot 150 carried from the ingot accommodating unit 132 and first positioned at the planarization position P2, the planarization step may not necessarily be carried out. Then, for the second ingot 150b accommodated in the ingot accommodating unit 132, the ingot carrying step is performed, and the holding step of holding it by the chuck table 20 positioned at the standby position P1 is carried out. Note that while the first ingot 150a positioned at the planarization step P2 and the second ingot 150b positioned at the standby position P1 are described in the same direction in FIG. 14 for convenience, the ingot 150 sucked by the chuck table 20 is set in an arbitrary direction by rotation of the turntable 18 and rotation of each chuck table 20, and this applies also to FIG. 15 and the like.

Figure 15:
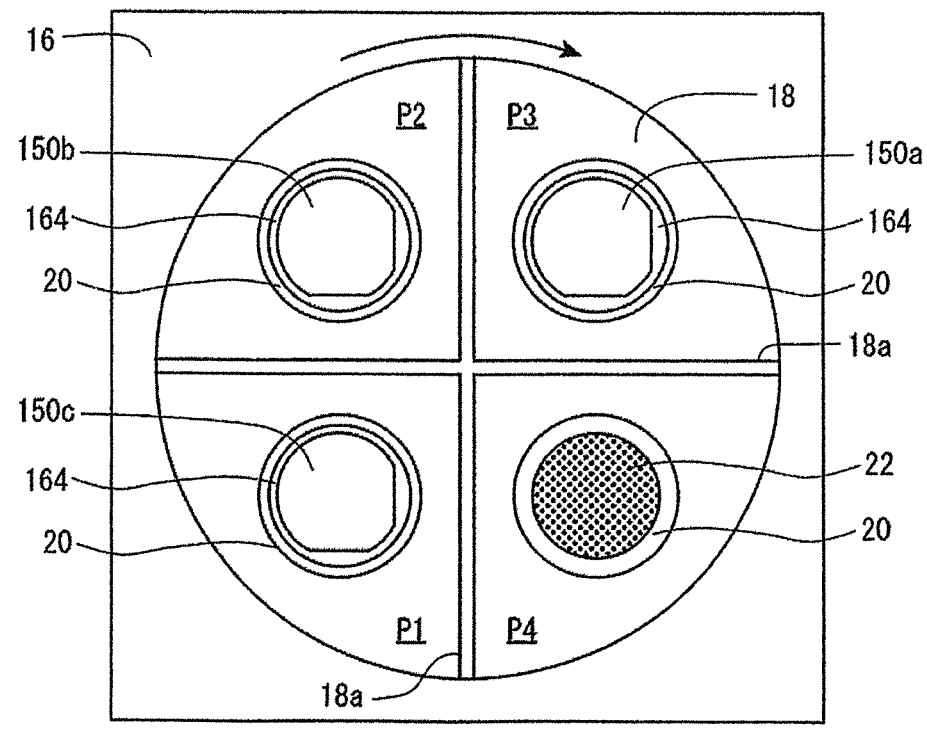
FIG. 15 is a plan view depicting a state in which a turntable is rotated by 90 degrees from the state depicted in FIG. 14 and a third ingot is positioned at the standby position.

After the ingot carrying step and the holding step are performed for the second ingot 150b, the turntable 18 is rotated by 90 degrees clockwise as viewed from above. By this, as depicted in FIG. 15, the first ingot 150a is moved to the laser applying position P3, and the second ingot 150b is moved to the planarization position P2. Then, for the first ingot 150a, a first production history forming step wherein a laser beam of such a wavelength as to be transmitted through the ingot 150 is applied to the ingot 150, with a focal point of the laser beam positioned in the inside of a region not to be formed with devices of a wafer to be produced secondly from the upper surface of the ingot 150 which has been planarized, to form a production history, is performed by the laser applying unit 8; next, an exfoliation layer forming step wherein a laser beam of such a wavelength as to be transmitted through the ingot 150 is applied to the ingot 150, with a focal point of the laser beam positioned at a depth corresponding to the thickness of a wafer to be produced firstly from the upper surface of the ingot 150 which has been planarized, to form an exfoliation layer, is conducted by the laser applying unit 8; and subsequently, a second production history forming step wherein a laser beam of such a wavelength as to be transmitted through the ingot 150 is applied to the ingot 150, with a focal point of the laser beam positioned in the inside of a region not to be formed with devices of the wafer to be produced firstly from the upper surface of the ingot 150 which has been planarized, to form a production history, is performed by the laser applying unit 8. On the other hand, as for the second ingot 150b, since the second ingot 150b is carried from the ingot accommodating unit 132 and firstly positioned at the planarization position P2 as aforementioned, the planarization step may not necessarily be carried out. In addition, for the third ingot 150c accommodated in the ingot accommodating unit 132, the ingot carrying step is performed, and the holding step of holding it by the chuck table 20 positioned at the standby position P1 is conducted.

Figure 16A:
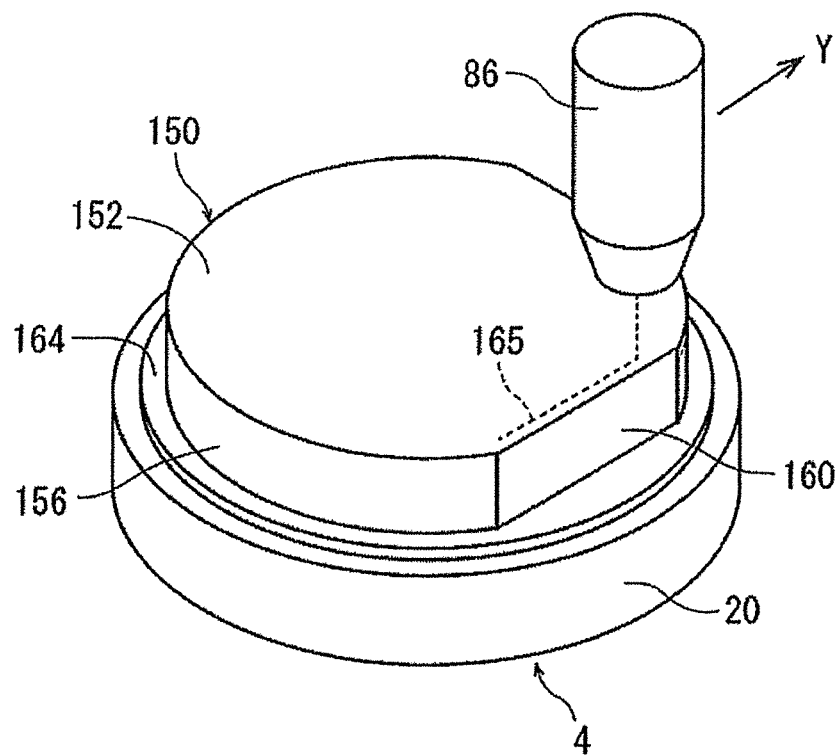
FIG. 16A is a perspective view depicting a state in which a first production history forming step is carried out.
Figure 16B:
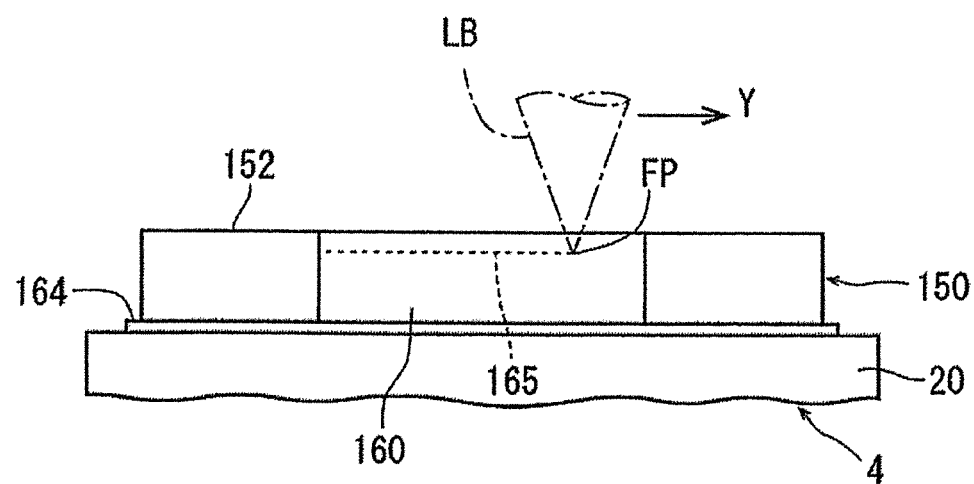
FIG. 16B is a front view depicting a state in which the first production history forming step is carried out.

The first production history forming step will be described referring to FIGS. 16A and 16B. In the first production history forming step, first, the X-axis direction movable plate 74 is moved by the X-axis direction moving mechanism 76 (see FIGS. 5 and 6) of the laser applying unit 8 and the Y-axis direction movable member 62 is moved by the Y-axis direction moving mechanism 64, to position the alignment unit 88 at a position on the upper side of the ingot 150, and the ingot 150 is imaged by the alignment unit 88 from above the ingot 150. Next, based on an image of the ingot 150 picked up by the alignment unit 88, the chuck table 20 is rotated by the chuck table motor, and the X-axis direction movable plate 74 is moved by the X-axis direction moving mechanism 76 and the Y-axis direction movable member 62 is moved by the Y-axis direction moving mechanism 64, to control the position of the focusing device 86. Subsequently, the focusing device 86 is moved in the Z-axis direction by the focal point position control means, whereby a focal point FP is positioned at a position which is on the first orientation flat 160 side and is in the inside of a peripheral surplus region not to be formed with devices of a wafer to be produced secondly from the upper surface of the ingot 150, as illustrated in FIGS. 16A and 16B. Next, while relatively moving the ingot 150 and the focal point FP appropriately, a pulsed laser beam LB of such a wavelength as to be transmitted through the ingot 150 is applied through the focusing device 86 to the ingot 150. By this, a production history 165 which can be configured in the form of a bar code can be formed in the inside of the peripheral surplus region not to be formed with devices of the wafer to be produced secondly from the upper surface of the ingot 150.

The production history 165 formed in the first production history forming step includes any one of the lot number of the ingot 150, the order of the wafer produced from the ingot 150, the production date of the wafer, the production plant of the wafer, and the wafer producing apparatus which has contributed to the production of the wafer. While the production history 165 is formed along the first orientation flat 160 in the present embodiment, the production history 165 may be formed in any region where devices are not formed of the wafer to be produced; for example, the production history 165 may be formed along the second orientation flat 162, or the production history 165 may be formed along an arcuate peripheral edge. At the time of relatively moving the ingot 150 and the focal point FP in the first production history forming step, the ingot 150 and the focal point FP can be relatively moved in the X-axis direction, the Y-axis direction and the circumferential direction of the ingot 150 by use of the X-axis direction moving mechanism 76, the Y-axis direction moving mechanism 64 and the chuck table motor. As for the depth of the production history 165, the production history 165 is spaced downward from the exfoliation layer 170 (described later) which is formed in the exfoliation layer forming step, such that the production history 165 will not be removed when the exfoliation surface of the ingot is ground and planarized after the wafer is exfoliated from the ingot 150. Such a first production history forming step may be carried out, for example, in the following processing conditions.

Figure 17A:
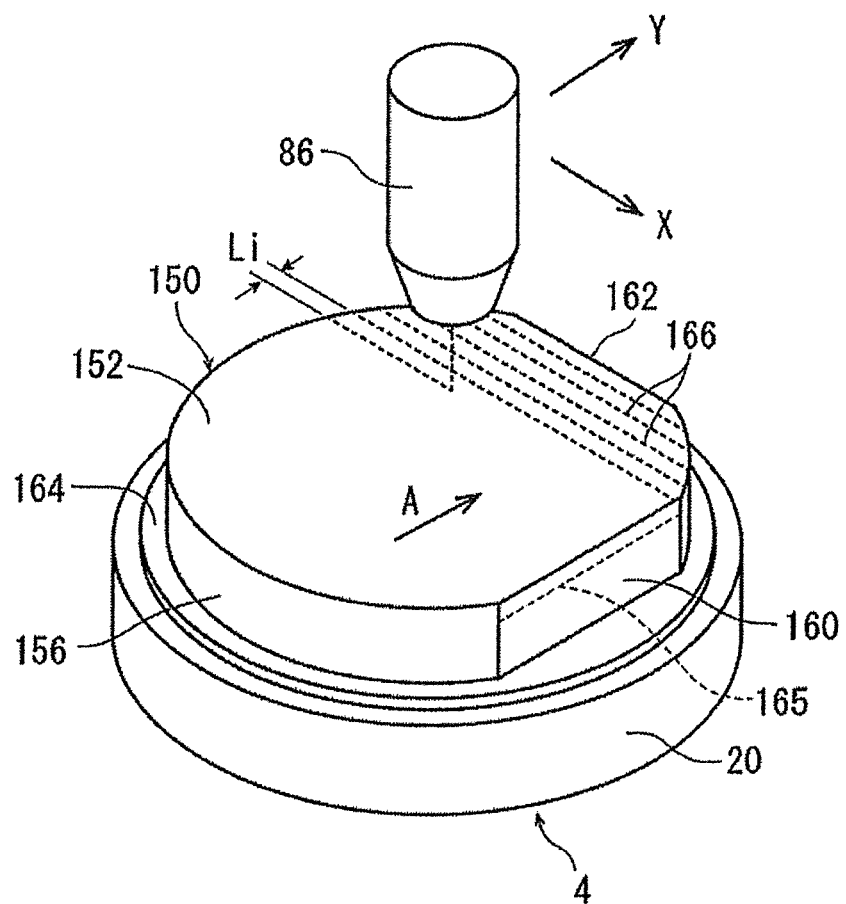
FIG. 17A is a perspective view depicting a state in which an exfoliation layer forming step is carried out.
Figure 17B:
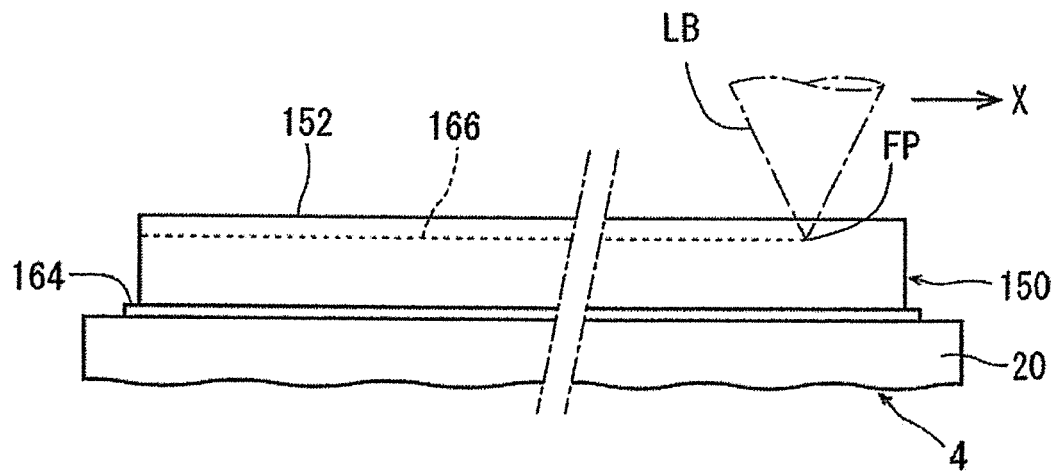
FIG. 17B is a front view depicting a state in which the exfoliation layer forming step is carried out.
Figure 18A:
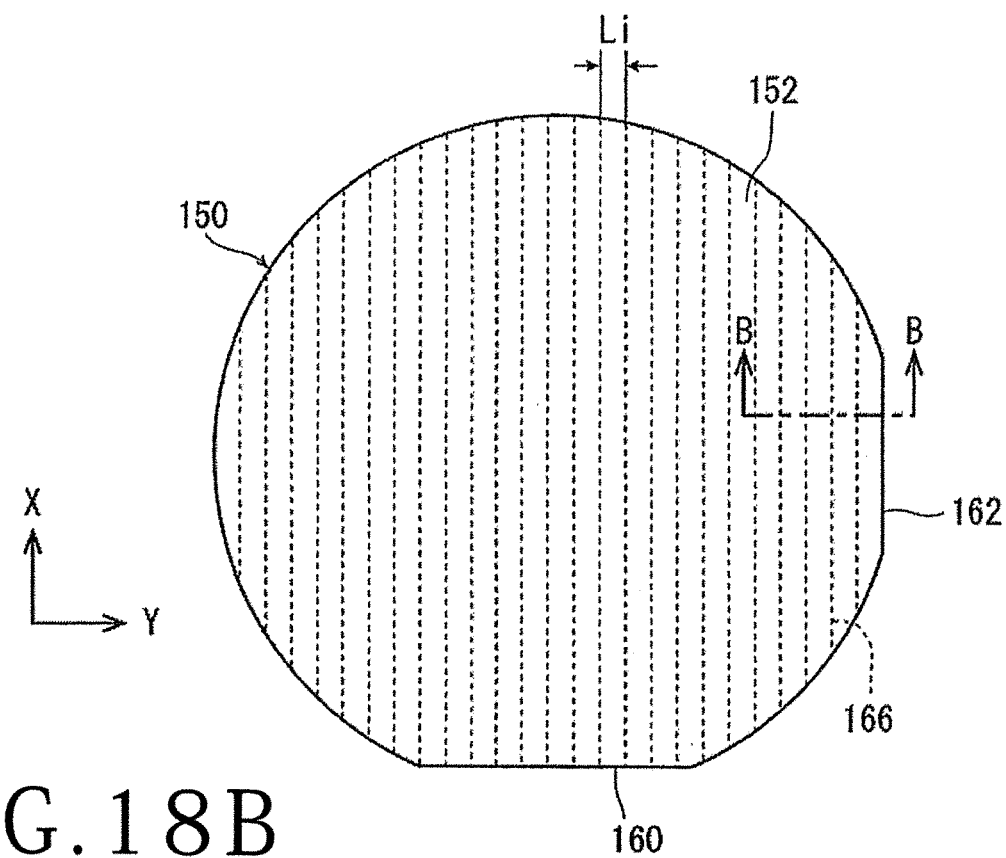
FIG. 18A is a plan view of a hexagonal single crystal SiC ingot formed with an exfoliation layer.

Wavelength of pulsed laser beam: 1,064 nm
Repetition frequency: 140 kHz
Average output: 1.0 W
Pulse width: 4 ns
Diameter of focal point: 3 μm
Numerical aperture (NA) of focusing lens: 0.7
Z-axis directional position of focal point: 420 to 430 μm from upper surface of ingot The exfoliation layer forming step will be described referring to FIGS. 17A to 18B. In the exfoliation layer forming step in the present embodiment, first, based on the image of the ingot 150 picked up in the first production history forming step, the chuck table 20 is rotated by the chuck table motor, and the X-axis direction movable plate 74 is moved by the X-axis direction moving mechanism 76 and the Y-axis direction movable member 62 is moved by the Y-axis direction moving mechanism 64, whereby the direction of the ingot 150 is controlled to a predetermined direction, and the positions of the ingot 150 and the focusing device 86 on an XY plane are controlled. At the time of controlling the direction of the ingot 150 to the predetermined direction, as depicted in FIG. 17A, the first orientation flat 160 is matched to the Y-axis direction, whereby the direction A in which the off angle α is formed is matched to the Y-axis direction, and the direction orthogonal to the direction A in which the off angle α is formed is matched to the X-axis direction. Next, the focusing device 86 is moved in the Z-axis direction by the focal point position control means, whereby the focal point FP is positioned at a depth corresponding to the thickness of the wafer to be produced firstly from the upper surface of the ingot 150, as depicted in FIG. 17B. Subsequently, an exfoliation layer forming processing is carried out wherein a pulsed laser beam LB of such a wavelength as to be transmitted through the ingot 150 is applied through the focusing device 86 to the ingot 150, while moving the focal point FP at a predetermined feeding speed relative to the ingot 150 in the X-axis direction matched to the direction orthogonal to the direction A in which the off angle α is formed, by moving the X-axis direction movable plate 74 by the X-axis direction moving mechanism 76. When the exfoliation layer forming processing is conducted, as illustrated in FIGS. 18A and 18B, rectilinear modified layers 166 formed by a process in which SiC is separated into Si (silicon) and C (carbon) by application of the pulsed laser beam LB, the pulsed laser beam LB applied next is absorbed by previously formed C, and SiC is thus separated into Si and C in a chain reaction manner, and cracks 168 propagating from the modified layers 166 to both sides of the modified layers 166 along the c-plane, are formed.

Figure 18B:
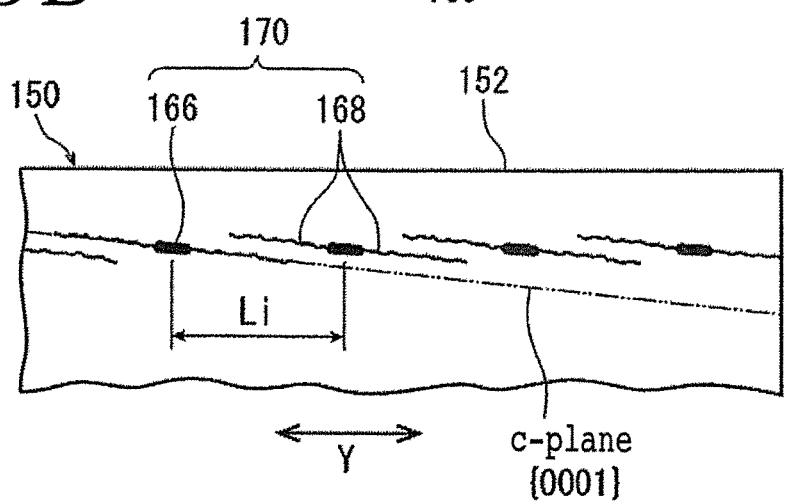
FIG. 18B is a sectional view taken along line B-B of FIG. 18A.

The description will be continued referring to FIGS. 17A and 18B. In the exfoliation layer forming step, subsequent to the exfoliation layer forming processing, the Y-axis direction movable member 62 is moved by the Y-axis direction moving mechanism 64, whereby the focal point FP is put to indexing feeding by a predetermined indexing amount Li relative to the ingot 150 in the Y-axis direction matched to the direction A in which the off angle α is formed. Then, the exfoliation layer forming processing and the indexing feeding are repeated in the exfoliation layer forming step, whereby a plurality of rectilinear modified layers 166 extending in the direction orthogonal to the direction A in which the off angle α is formed are formed at intervals of the predetermined indexing amount Li in the direction A in which the off angle α is formed, and it is ensured that the crack 168 and the crack 168 adjacent to each other in the direction in which the off angle α is formed do not overlap each other as viewed in the vertical direction. By this, exfoliation layers 170 for exfoliating the wafer from the ingot 150, which include the pluralities of modified layers 166 and cracks 168, can be formed at a depth corresponding to the thickness of the wafer to be produced from the upper surface of the ingot 150. Such an exfoliation layer forming step may be carried out, for example, in the following processing conditions.

Figure 19A:
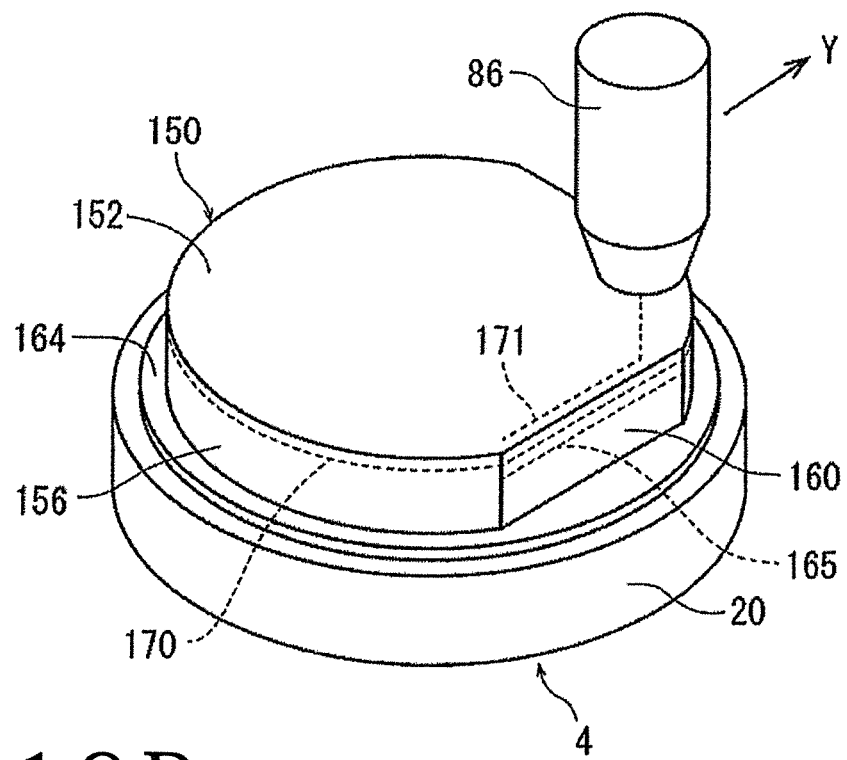
FIG. 19A is a perspective view depicting a state in which a second production history forming step is carried out.
Figure 19B:
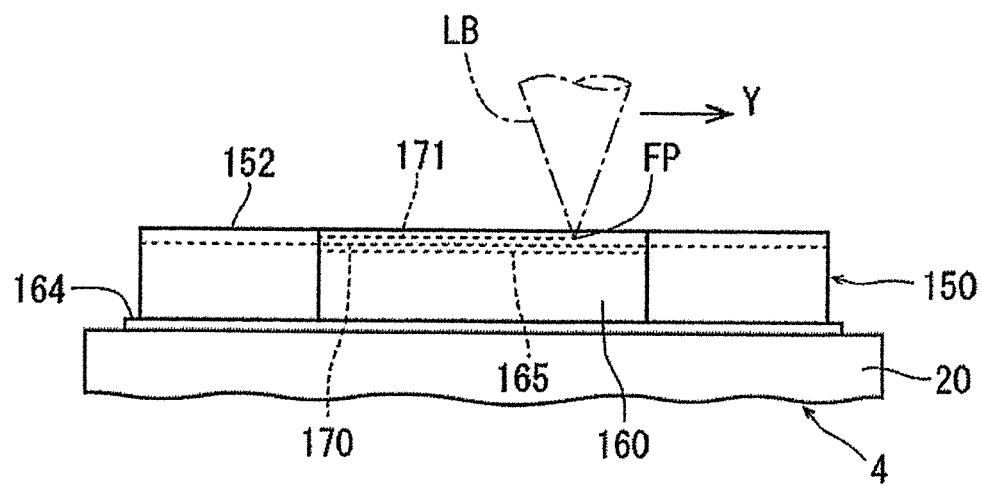
FIG. 19B is a front view depicting a state in which the second production history forming step is carried out.

Wavelength of pulsed laser beam: 1,064 nm
Repetition frequency: 140 kHz
Average output: 14 W
Pulse width: 4 ns
Diameter of focal point: 3 μm
Numerical aperture (NA) of focusing lens: 0.7
Z-axis directional position of focal point: 300 μm from upper surface of ingot
Feeding speed of focal point: 765 mm/s
Indexing amount: 250 to 400 μm The second production history forming step will be described referring to FIGS. 19A and 19B. In the second production history forming step, first, the position of the focusing device 86 is controlled based on the image of the ingot 150 picked up in the first production history forming step, after which the focusing device 86 is moved in the Z-axis direction by the focal point position control means, whereby the focal point FP is positioned at a position which is on the first orientation flat 160 side and is in the inside of a peripheral surplus region not to be formed with devices of the wafer to be produced firstly from the upper surface of the ingot 150, as illustrated in FIGS. 19A and 19B. Next, while relatively moving the ingot 150 and the focal point FP appropriately, a pulsed laser beam LB of such a wavelength as to be transmitted through the ingot 150 is applied through the focusing device 86 to the ingot 150. By this, a production history 171 which can be configured in the form of a bar code can be formed in the inside of the peripheral surplus region not to be formed with devices of the wafer to be produced firstly from the upper surface of the ingot 150. Like the production history 165 formed in the first production history forming step, the production history 171 formed in the second production history forming step includes any one of the lot number of the ingot 150, the order of the wafer produced from the ingot 150, the production date of the wafer, the production plant of the wafer, and the wafer producing apparatus which has contributed to the production of the wafer. While the production history 171 is formed along the first orientation flat 160 in the present embodiment, the production history 171 may be formed in any region where devices are not formed of the wafer to be produced; for example, the production history 171 may be formed along the second orientation flat 162, or the production history 171 may be formed along an arcuate peripheral edge. At the time of relatively moving the ingot 150 and the focal point FP in the second production history forming step, the ingot 150 and the focal point FP can be relatively moved in the X-axis direction, the Y-axis direction and the circumferential direction of the ingot 150, by use of the X-axis direction moving mechanism 76, the Y-axis direction moving mechanism 64 and the chuck table motor. As for the depth of the production history 171, the production history 171 is spaced upward from the exfoliation layer 170 formed in the exfoliation layer forming step, such that the production history 171 will not be removed when the exfoliation plane of the wafer is ground and planarized after the wafer is exfoliated from the ingot 150. Such a second production history forming step may be carried out, for example, in the following processing conditions.

Figure 20:
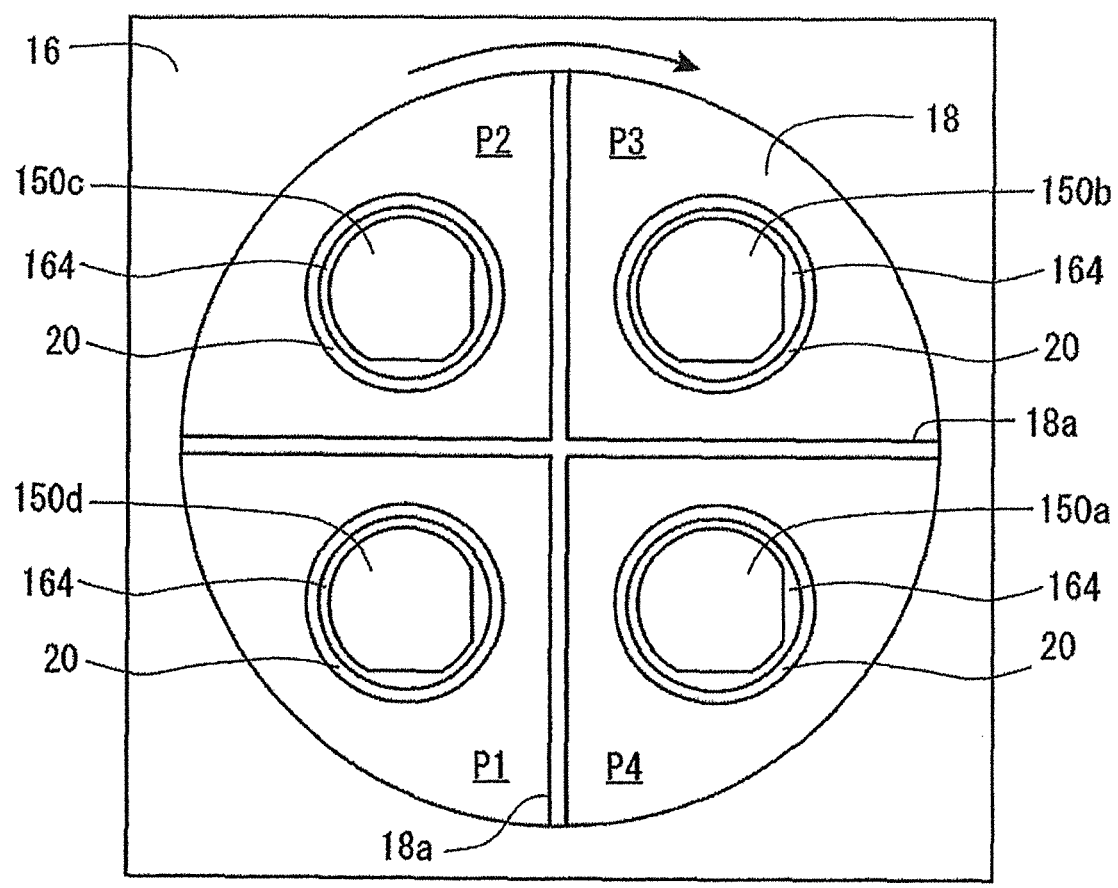
FIG. 20 is a plan view depicting a state in which the turntable is rotated by 90 degrees from the state depicted in FIG. 15 and a fourth ingot is positioned at the standby position.

Wavelength of pulsed laser beam: 1,064 nm
Repetition frequency: 140 kHz
Average output: 1.0 W
Pulse width: 4 ns
Diameter of focal point: 3 μm
Numerical aperture (NA) of focusing lens: 0.7
Z-axis directional position of focal point: 100 μm from upper surface of ingot After the first production history forming step, the exfoliation layer forming step and the second production history forming step are performed for the first ingot 150*a* and the ingot carrying step and the holding step are conducted for the third ingot 150*c*, the turntable 18 is rotated by 90 degrees clockwise as viewed from above. By this, as depicted in FIG. 20, the first ingot 150*a* is moved to the wafer exfoliation position P4, the second ingot 150*b* is moved to the laser applying position P3, and the third ingot 150*c* is moved to the planarization position P2. Then, for the first ingot 150*a*, a wafer producing step (wafer exfoliation step) of exfoliating the wafer to be produced firstly from the ingot 150, with the exfoliation layer 170 as a starting point of exfoliation, to produce the wafer is carried out by the wafer exfoliating unit 10. In addition, for the second ingot 150*b*, the first production history forming step, the exfoliation layer forming step and the second production history forming step are performed. On the other hand, for the third ingot 150*c*, the planarization step may not necessarily be carried out, since the third ingot 150*c* has been carried from the ingot accommodating unit 132 and firstly positioned at the planarization position P2 as aforementioned. Besides, for the fourth ingot 150*d* accommodated in the ingot accommodating unit 132, the ingot carrying step is performed, and the holding step of holding it by the chuck table 20 positioned at the standby position P1 is conducted.

Figure 21A:
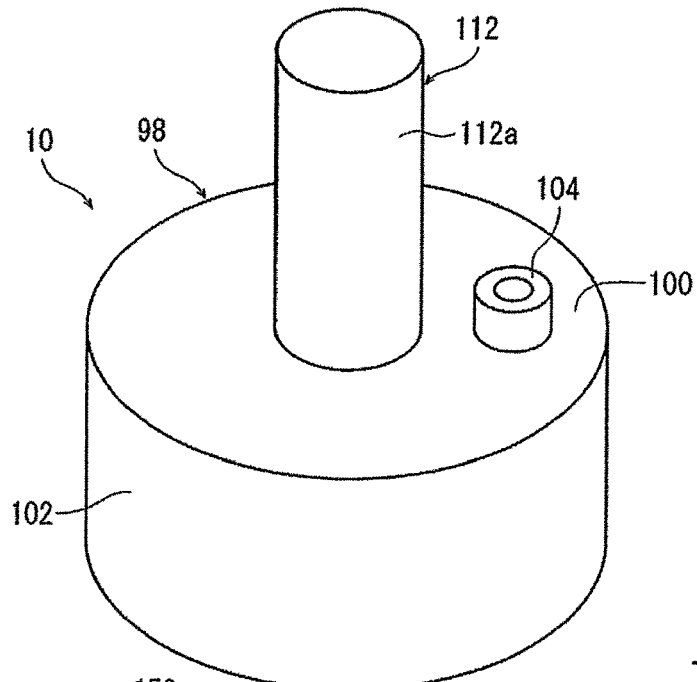
FIG. 21A is a perspective view depicting a state in which a liquid tank is positioned on the upper side of a chuck table.
Figure 21B:
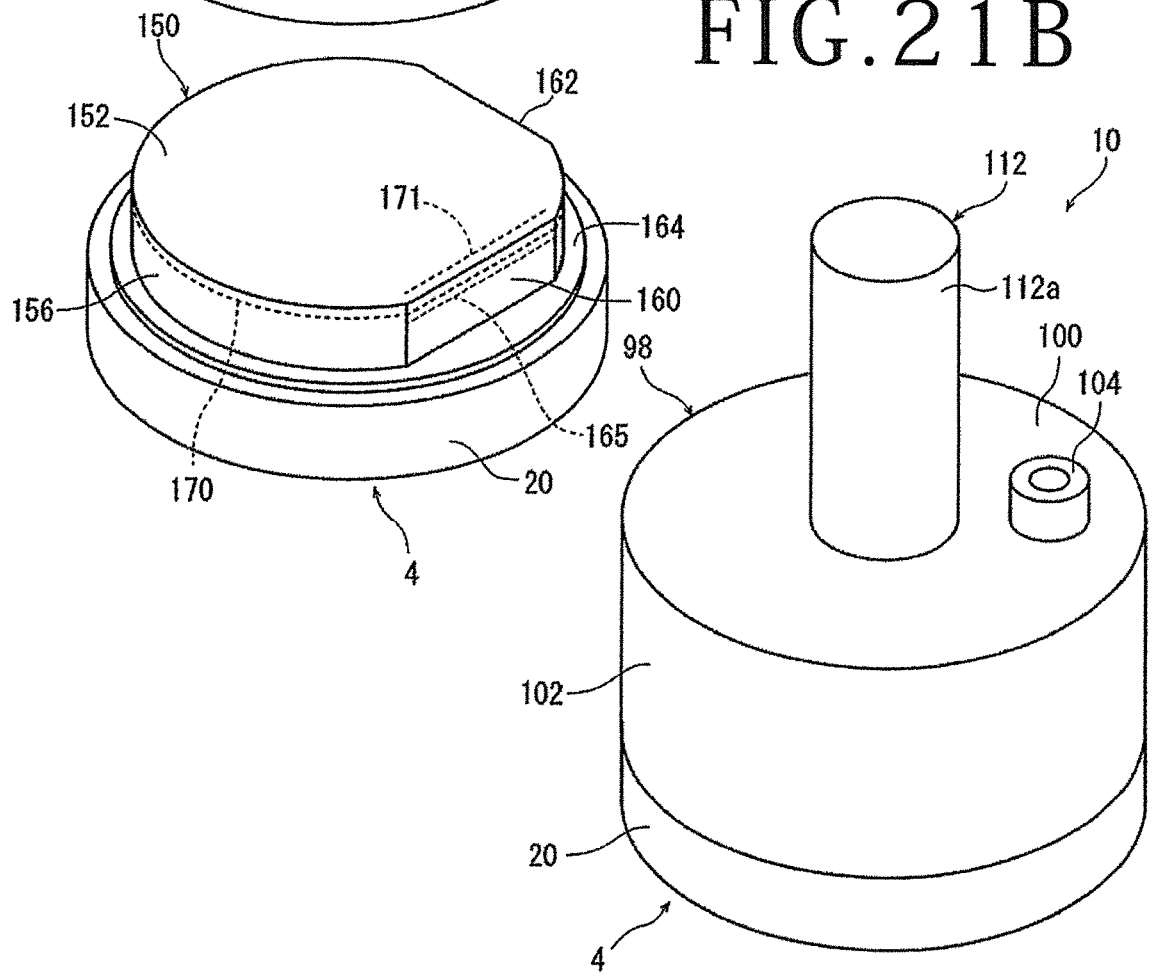
FIG. 21B is a perspective view depicting a state in which a lower surface of the liquid tank makes contact with an upper surface of the chuck table.
Figure 22:
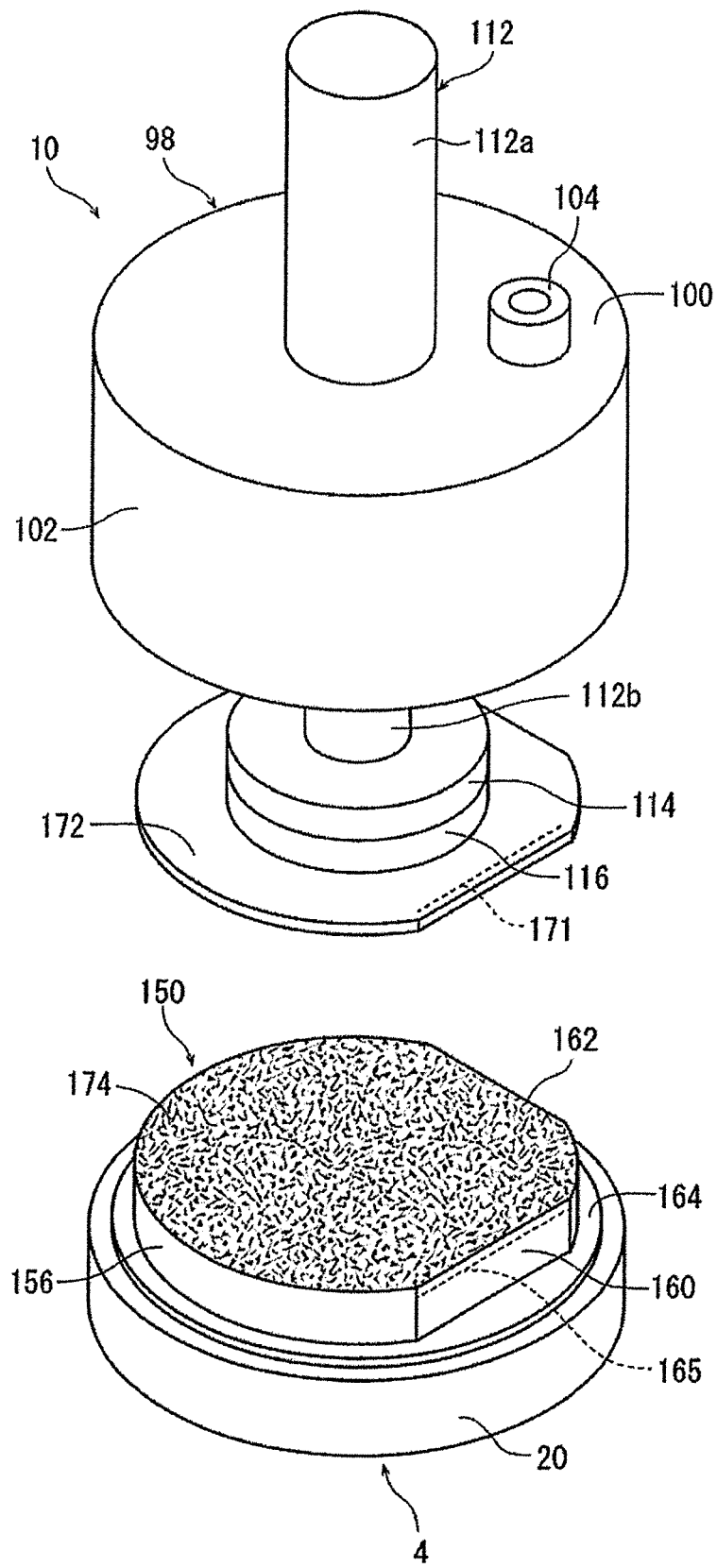
FIG. 22 is a perspective view depicting a state in which a wafer is exfoliated from an ingot by the wafer exfoliating unit.

The wafer producing step will be described referring to FIGS. 9, 21A, 21B and 22. In the wafer producing step in the present embodiment, first, as depicted in FIGS. 21A and 21B, the arm 92 is lowered by the arm moving mechanism 94, to put the lower end of the side wall 102 of the liquid tank 98 into close contact with the upper surface of the chuck table 20. Next, as illustrated in FIG. 9, the piston rod 112*b* of the air cylinder 112 is moved, to bring the lower surface of the suction piece 116 into close contact with the upper surface of the ingot 150. Subsequently, the suction means connected to the suction piece 116 is operated to generate a suction force at the lower surface of the suction piece 116, to cause the lower surface of the suction piece 116 to suck and hold the upper surface of the ingot 150. Next, the liquid supply means connected to the liquid supply section 104 is operated, to supply the liquid 110 (for example, water) from the liquid supply section 104 into the liquid accommodating space 108 until the ultrasonic vibration generating member 114 is immersed in the liquid 110. Subsequently, the ultrasonic vibration generating member 114 is operated to apply ultrasonic vibration to the ingot 150, whereby the wafer 172 to be produced can be exfoliated from the ingot 150, with the exfoliation layer 170 as a starting point of exfoliation, and the wafer 172 can be produced. Next, the arm 92 is moved upward by the arm moving mechanism 94, and the liquid 110 is discharged from the liquid accommodating space 108. The liquid 110 discharged from the liquid accommodating space 108 is discharged to the outside of the wafer producing apparatus 2 through a discharge port 16*a* (see FIG. 2) formed in the turntable accommodating section 16 adjacently to the wafer exfoliating unit 10. Then, as depicted in FIGS. 21A and 21B, the piston rod 112*b* of the air cylinder 112 is lowered until the wafer 172 produced from the ingot 150 protrudes downward beyond the lower end of the side wall 102 of the liquid tank 98. Note that as depicted in FIG. 22, an exfoliation surface 174 of the ingot 150 from which the wafer 172 has been exfoliated is rugged, and the height of the ruggedness of the exfoliation surface 174 is, for example, approximately 20 to 30 μm.

After the wafer producing step is performed for the first ingot 150*a*, a wafer carrying step of carrying the wafer 172 produced from the first ingot 150*a* from the wafer exfoliating unit 10 to the wafer accommodating unit 12 is conducted by the wafer carrying unit 118. In the wafer carrying step, the first arm 124 is operated by the first motor 122 of the wafer carrying unit 118, and the second arm 128 is operated by the second motor 126, to position the suction piece 130 of the wafer carrying unit 118 at a position under the wafer 172 exfoliated by the wafer exfoliating unit 10 and sucked by the suction piece 116. Next, the lift means 120 is operated to put the upper surface of the suction piece 130 of the wafer carrying unit 118 into close contact with the lower surface of the wafer 172. Subsequently, the operation of the suction means connected to the suction piece 116 of the wafer exfoliating unit 10 is stopped, to release the suction force at the suction piece 116 of the wafer exfoliating unit 10, and the suction means connected to the suction piece 130 of the wafer carrying unit 118 is operated to generate a suction force at the upper surface of the suction piece 130 of the wafer carrying unit 118, thereby sucking the lower surface of the wafer 172 onto the upper surface of the suction piece 130 of the wafer carrying unit 118. By this, the wafer 172 is transferred from the wafer exfoliating unit 10 to the wafer carrying unit 118. Next, the first arm 124 and the second arm 128 are operated by the lift means 120, the first motor 122 and the second motor 126, whereby the wafer 172 sucked by the suction piece 130 of the wafer carrying unit 118 can be carried from the wafer exfoliating unit 10 to the wafer accommodating unit 12 and be accommodated in the latter. In the present embodiment, the wafer 172 produced from the first ingot 150a is accommodated in the first cassette 131a, in order to make it possible to easily distinguish from which ingot the wafer has been produced.

Figure 23:
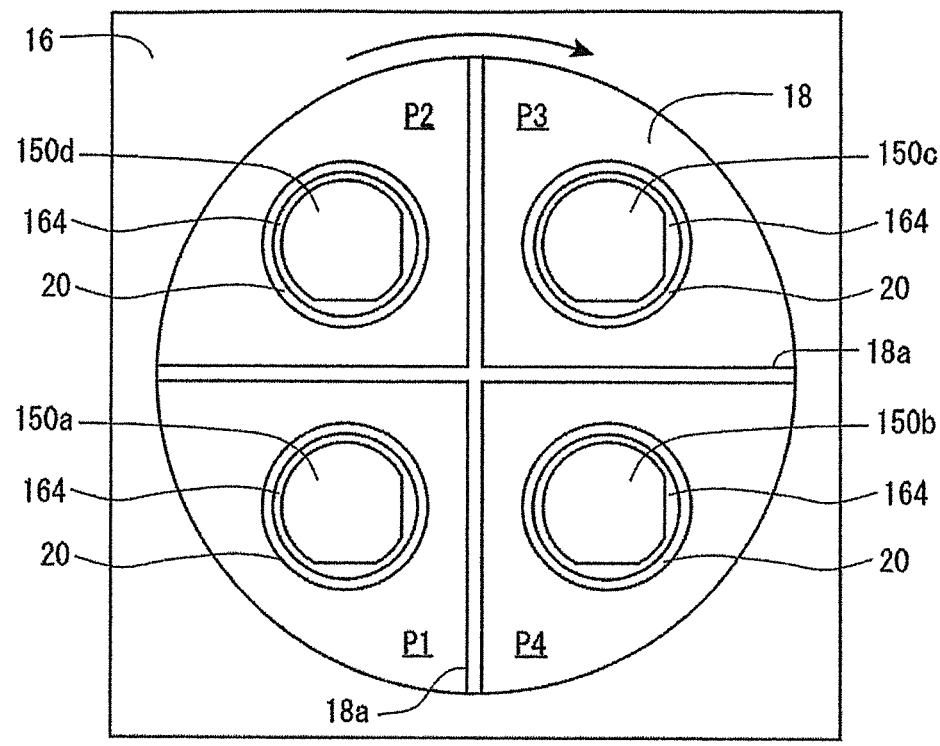
FIG. 23 is a plan view depicting a state in which the turntable is rotated by 90 degrees from the state depicted in FIG. 20.

After the wafer producing step is performed for the first ingot 150a, the wafer carrying step is conducted for the wafer 172 produced from the first ingot 150a, the first production history forming step, the exfoliation layer forming step and the second production history forming step are performed for the second ingot 150b, and the ingot carrying step and the holding step are conducted for the fourth ingot 150d, the turntable 18 is rotated by 90 degrees clockwise as viewed from above. By this, as depicted in FIG. 23, the first ingot 150a is moved to the standby position P1, the second ingot 150b is moved to the wafer exfoliation position P4, the third ingot 150c is moved to the laser applying position P3, and the fourth ingot 150d is moved to the planarization position P2. Then, the wafer producing step is performed for the second ingot 150b, and the wafer carrying step is conducted for the wafer 172 produced from the second ingot 150b. In the present embodiment, the wafer 172 produced from the second ingot 150b is accommodated into the second cassette 131b. In addition, the first production history forming step, the exfoliation layer forming step and the second production history forming step are performed for the third ingot 150c. On the other hand, for the fourth ingot 150d, the planarization step may not necessarily be carried out, since the fourth ingot 150d has been carried from the ingot accommodating unit 132 and be firstly positioned at the planarization position P2 as aforementioned. Note that the first ingot 150a stands by at the standby position P1 until the turntable 18 is rotated next.

Figure 24:
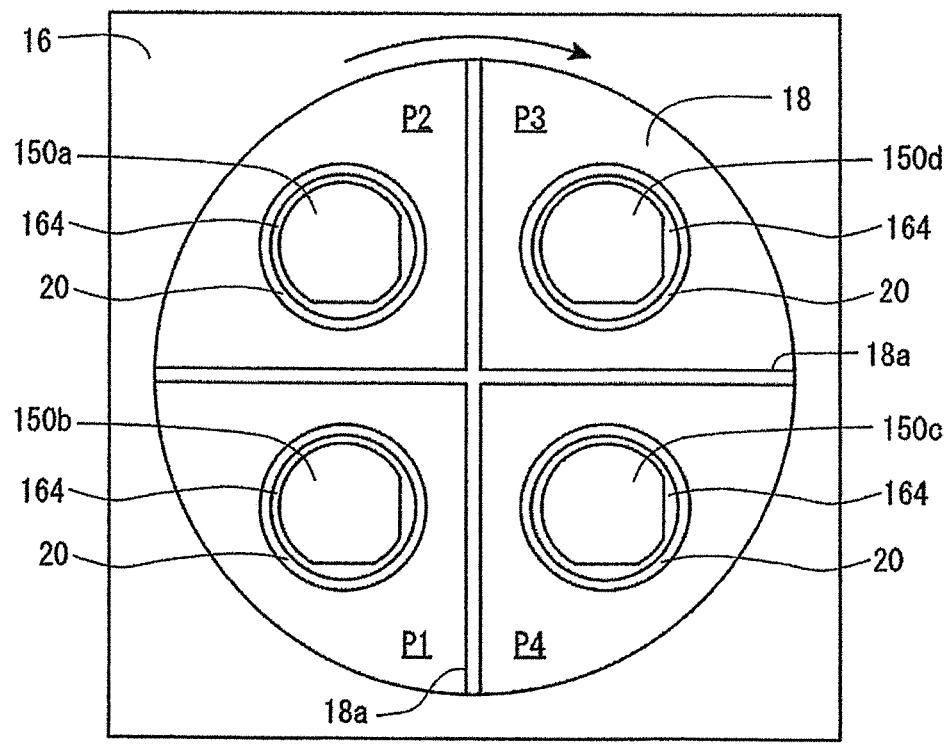
FIG. 24 is a plan view depicting a state in which the turntable is rotated by 90 degrees from the state depicted in FIG. 23.

After the wafer producing step is performed for the second ingot 150b, the wafer carrying step is conducted for the wafer 172 produced from the second ingot 150b, and the first production history forming step, the exfoliation layer forming step and the second production history forming step are performed for the third ingot 150c, the turntable 18 is rotated by 90 degrees clockwise as viewed from above. By this, as illustrated in FIG. 24, the first ingot 150a is moved to the planarization position P2, the second ingot 150b is moved to the standby position P1, the third ingot 150c is moved to the wafer exfoliation position P4, and the fourth ingot 150d is moved to the layer applying position P3. Then, for the first ingot 150a, the planarization step of grinding the upper surface of the ingot 150 to planarize the upper surface is carried out by the planarizing unit 6. For the third ingot 150c, the wafer producing step is conducted, and, for the wafer 172 produced from the third ingot 150c, the wafer carrying step is performed. In the present embodiment, the wafer 172 produced from the third ingot 150c is accommodated into the third cassette 131c. For the fourth ingot 150d, the first production history forming step, the exfoliation layer forming step and the second production history forming step are carried out. Note that the second ingot 150b stands by at the standby position P1 until the turntable 18 is rotated next.

The planarization step will be described referring to FIGS. 2 and 3. In the planarization step, first, the chuck table 20 holding the ingot 150 from which the wafer 172 has been exfoliated is rotated by the chuck table motor at a predetermined rotating speed (for example, 300 rpm) counterclockwise as viewed from above. In addition, the spindle 40 is rotated by the motor 36 at a predetermined rotating speed (for example, 6,000 rpm) counterclockwise as viewed from above. Next, the Z-axis direction movable plate 26 is lowered by the Z-axis direction moving mechanism 28, to put the grindstones 48 into contact with the exfoliation surface 174 of the ingot 150. After the grindstones 48 are put into contact with the exfoliation surface 174, the Z-axis direction movable plate 26 is lowered at a predetermined grinding feeding speed (for example, 1.0 μm/s) by the Z-axis direction moving mechanism 28. By this, the exfoliation surface 174 of the ingot 150 from which the wafer 172 has been exfoliated is ground, whereby the exfoliation surface 174 of the ingot 150 can be planarized to such an extent as not to hamper the incidence of the pulsed laser beam LB in the first and second production history forming steps and the exfoliation layer forming step. Note that where a thickness measuring instrument (not depicted) is put in contact with the exfoliation surface 174 of the ingot 150 at the time of grinding and planarizing the exfoliation surface 174 of the ingot 150, it is possible, upon detection of that the thickness of the ingot 150 measured by the thickness measuring instrument has been reduced by a predetermined amount (for example, an amount of 20 to 30 μm corresponding to the height of the ruggedness of the exfoliation surface 174), to detect that the upper surface of the ingot 150 has been planarized. Besides, in the planarization step, grinding water is supplied from grinding water supply means (not depicted) to the grinding region, during grinding of the exfoliation surface 174 of the ingot 150, and the grinding water supplied to the grinding region is discharged to the outside of the wafer producing apparatus 2 through the discharge port 16b (see FIG. 2) formed in the turntable accommodating section 16 adjacently to the planarizing unit 6.

Figure 25:
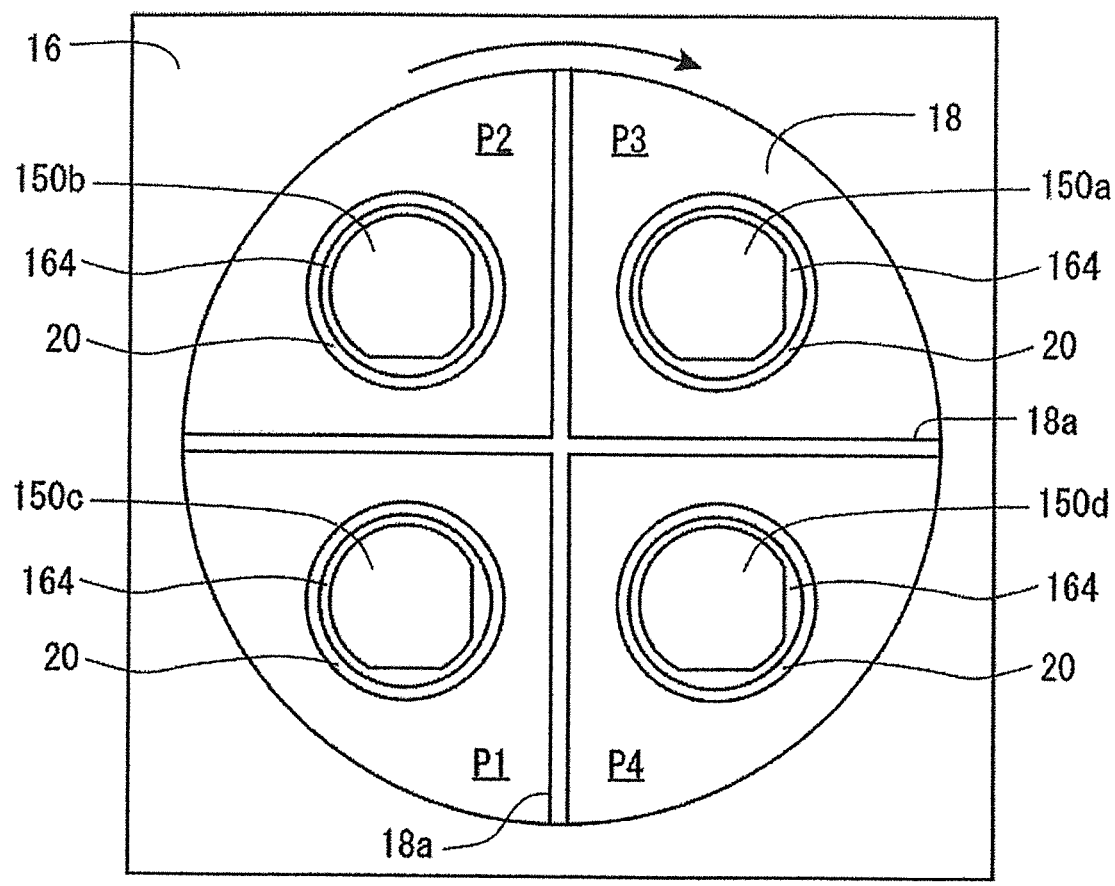
FIG. 25 is a plan view depicting a state in which the turntable is rotated by 90 degrees from the state depicted in FIG. 24.

After the planarization step is performed for the first ingot 150a, the wafer producing step is conducted for the third ingot 150c, the wafer carrying step is carried out for the wafer 172 produced from the third ingot 150c, and the first production history forming step, the exfoliation layer forming step and the second production history forming step are performed for the fourth ingot 150d, the turntable 18 is rotated by 90 degrees clockwise as viewed from above. By this, as illustrated in FIG. 25, the first ingot 150a is moved to the laser applying position P3, the second ingot 150b is moved to the planarization position P2, the third ingot 150c is moved to the standby position P1, and the fourth ingot 150d is moved to the wafer exfoliation position P4. In this instance, as depicted in FIG. 4, the cleaning unit 50 is operated, the cleaning water 55 is jetted downward from the jet holes of the first cleaning section 54 obliquely toward the planarizing unit 6 side to remove grinding swarf from the first ingot 150a, and the drying air 57 is jetted downward from the jet holes of the second cleaning section 56 to remove the cleaning water 55 from the first ingot 150a, whereby the first ingot 150a having been planarized by the planarizing unit 6 is cleaned and dried.

Then, for the first ingot 150a, the first production history forming step and the exfoliation layer forming step are conducted, but the second production history forming step may not be carried out, since the production history formed in the first production history forming step before exfoliation of the wafer 172 has already been formed in the wafer yet to be produced. In the first production history forming step carried out here, the new production history 165 is formed at a deep position from the upper surface of the ingot 150 as compared to the previously formed production history 165; in this case, in order that the pulsed laser beam LB applied to the ingot 150 in the first production history forming step carried out here is not intercepted by the previously formed production history 165, the new production history 165 is formed in such a manner as not to overlap the previously formed production history 165 as viewed in the vertical direction (for example, with a spacing of approximately 50 µm from the previously formed production history 165). In addition, for the second ingot 150b, the planarization step is carried out. For the fourth ingot 150d, the wafer producing step is performed, and, for the wafer 172 produced from the fourth ingot 150d, the wafer carrying step is conducted. In the present embodiment, the wafer 172 produced from the fourth ingot 150d is accommodated into the fourth cassette 131d. Note that the third ingot 150c stands by at the standby position P1 until the turntable 18 is rotated next.

After the planarization step, the first production history forming step, the exfoliation layer forming step, the second production history forming step, and the wafer producing step are firstly carried out for each of the ingots 150, the turntable 18 is rotated by 90 degrees clockwise as viewed from above, whereby the ingots 150 are sequentially positioned at the standby position P1, the planarization position P2, the laser applying position P3 and the wafer exfoliation position P4, then the planarization step, the first production history forming step, the exfoliation layer forming step, and the wafer producing step are sequentially repeated, and the wafer carrying step is conducted for each wafer 172 exfoliated by the wafer exfoliating unit 10, whereby the number of wafers 172 which can be produced from each ingot 150 are produced, and the produced wafers 172 are accommodated into the wafer accommodating unit 12.

In the present embodiment, after the number of wafers 172 which can be produced from each ingot 150 are produced, a substrate recovery step can be carried out wherein the substrate 164 on which the material of the ingot 150 is slightly left is carried to an appropriate recovery container 176 (see FIGS. 1 and 2) disposed on an end portion of the upper surface of the base 14 by the ingot carrying unit 134 and is recovered. In the substrate recovery step, first, the arm 138 is moved by the arm moving mechanism 140 of the ingot carrying unit 134, to position the suction piece 146 at a position on the upper side of the substrate 164 positioned at the standby position P1. Next, the suction piece 146 is lowered by the air cylinder 144, to put the lower surface of the suction piece 146 into close contact with the upper surface of the substrate 164. Subsequently, the suction means connected to the suction piece 146 is operated to generate a suction force at the lower surface of the suction piece 146, to suck the lower surface of the suction piece 146 onto the upper surface of the substrate 146. Next, the suction piece 146 is moved upward by the air cylinder 144, and the arm 138 is moved by the arm moving mechanism 140, to position the suction piece 146 at a position on the upper side of the recovery container 176. Subsequently, the suction force at the suction piece 146 is released, to recover the substrate 164 into the recovery container 176. Then, the turntable is rotated and the substrate recovery step is sequentially carried out for the substrate 164 positioned at the standby position P1, whereby all the substrates 164 can be carried to the recovery container 176 and recovered.

As has been described above, in the present embodiment, a history of the wafer 172 exfoliated from the ingot 150 is formed in the inside of the wafer 172, the history of the wafer 172 can be confirmed in the process of forming devices, so that in the case where a defect is generated in a device, it is possible to trace back the history of the wafer 172 and investigate the cause of the defect of the device, leading to prevention of recurrence of the defect. In addition, the present embodiment includes the first production history forming step of forming the production history in the inside of a region not formed with devices of a wafer to be produced secondly from the upper surface of the ingot which has been planarized. Therefore, even after the wafer 172 is exfoliated from the ingot 150, for example, even in the case where wafers 172 are produced from the ingot 150 but the ingot 150 is taken out of the wafer producing apparatus 2 before completion of formation of the number of wafers 172 which can be produced, the ingot 150 can be specified by the production history 165 formed in the first production history forming step.

Note that an example wherein the focal point FP is moved relative to the ingot 150 in the direction orthogonal to the direction A in which the off angle α is formed in the exfoliation layer forming step and wherein the focal point FP is moved relative to the ingot 150 in the direction A in which the off angle α is formed in the indexing feeding has been described in the present embodiment. However, the direction of movement of the focal point FP relative to the ingot 150 in the exfoliation layer forming step may not necessarily be the direction orthogonal to the direction A in which the off angle α is formed, and the direction of movement of the focal point FP relative to the ingot 150 in the indexing feeding may not necessarily be the direction A in which the off angle α is formed. In addition, the wafer producing apparatus 2 may include wafer grinding means grinding the exfoliation surface of the wafer 172 exfoliated from the ingot 150.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer producing method for producing a wafer from a hexagonal single crystal ingot, the wafer producing method comprising:
   a planarization step of planarizing an upper surface of the hexagonal single crystal ingot;
   a first production history forming step of applying a laser beam of such a wavelength as to be transmitted through the hexagonal single crystal ingot to the hexagonal single crystal ingot, with a focal point of the laser beam positioned in an inside of a region not to be formed with devices of a wafer to be produced secondly, from the upper surface of the hexagonal single crystal ingot which has been planarized, to form a production history;
   an exfoliation layer forming step of applying a laser beam of such a wavelength as to be transmitted through the hexagonal single crystal ingot to the hexagonal single crystal ingot, with a focal point of the laser beam positioned at a depth corresponding to a wafer to be produced firstly, from the upper surface of the hexagonal single crystal ingot which has been planarized, to form an exfoliation layer;

a second production history forming step of applying a laser beam of such a wavelength as to be transmitted through the hexagonal single crystal ingot to the hexagonal single crystal ingot, with a focal point of the laser beam positioned in an inside of a region not to be formed with devices of the wafer to be produced firstly, from the upper surface of the hexagonal single crystal ingot which has been planarized, to form a production history; and a wafer exfoliation step of exfoliating the wafer to be produced firstly from the hexagonal single crystal ingot, with the exfoliation layer as a starting point of exfoliation, to produce a wafer, wherein the planarization step, the first production history forming step, the exfoliation layer forming step, and the wafer exfoliation step are repeated.

2. The wafer producing method according to claim 1, wherein the production histories formed in the first production history forming step and the second production history forming step include any one of a lot number of the hexagonal single crystal ingot, an order of the wafer produced, a production date of the wafer, a production plant of the wafer, and a machine model that has contributed to the production of the wafer.

3. The wafer producing method according to claim 1, wherein the hexagonal single crystal ingot is a hexagonal single crystal SiC ingot having a first surface, a second surface opposite to the first surface, a c-axis extending from the first surface to the second surface, and a c-plane orthogonal to the c-axis, with the c-axis being inclined relative to a perpendicular to the first surface, and with an off angle being formed by the c-plane and the first surface, and in the exfoliation layer forming step, a pulsed laser beam of such a wavelength as to be transmitted through the hexagonal single crystal SiC ingot is applied to the hexagonal single crystal SiC ingot, with a focal point of the pulsed laser beam positioned at a depth corresponding to a thickness of a wafer to be produced from the first surface, and with the hexagonal single crystal SiC ingot and the focal point being relatively moved in a first direction orthogonal to a second direction in which the off angle is formed, to cause SiC to be separated into Si and C, to cause the pulsed laser beam applied next to be absorbed in previously formed C, and to cause SiC to be separated into Si and C in a chain reaction manner, thereby forming a rectilinear modified layer and forming a crack extending from the modified layer along the c-plane, and the hexagonal single crystal SiC ingot and the focal point are relatively moved in the direction in which the off angle is formed, to perform indexing by a predetermined amount, thereby forming the exfoliation layer.

* * * * *